US012568737B1

(12) United States Patent
Sun

(10) Patent No.: US 12,568,737 B1
(45) Date of Patent: Mar. 3, 2026

(54) DISPLAY PANEL AND DISPLAY DEVICE

(71) Applicant: Wuhan Tianma Micro-Electronics Co., Ltd., Wuhan (CN)

(72) Inventor: Pengju Sun, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 19/051,168

(22) Filed: Feb. 12, 2025

(30) Foreign Application Priority Data

Aug. 29, 2024　(CN) .......................... 202411207637.8

(51) Int. Cl.
H10K 59/13 (2023.01)
G09G 3/3233 (2016.01)
H10K 59/121 (2023.01)
H10K 59/131 (2023.01)
H10K 59/35 (2023.01)

(52) U.S. Cl.
CPC ........... H10K 59/13 (2023.02); G09G 3/3233 (2013.01); H10K 59/1216 (2023.02); H10K 59/131 (2023.02); G09G 2300/0426 (2013.01); G09G 2300/0852 (2013.01); G09G 2320/0233 (2013.01); G09G 2320/0242 (2013.01); H10K 59/35 (2023.02)

(58) Field of Classification Search
CPC ... G09G 2300/0426; G09G 2300/0819; G09G 2300/0842; G09G 2300/0852; G09G 2300/0861; G09G 2310/0251; G09G 2320/0209; G09G 2320/0214; G09G 2320/0219; G09G 2320/043

See application file for complete search history.

(56) References Cited

U.S. PATENT DOCUMENTS

2007/0109239 A1*　5/2007　den Boer .............. G06F 3/0416
345/87
2017/0221423 A1*　8/2017　Xiang ................... G09G 3/3233

* cited by examiner

*Primary Examiner* — Shaheda A Abdin
(74) *Attorney, Agent, or Firm* — Anova Law Group, PLLC

(57) ABSTRACT

A display panel and a display device are provided. The display panel includes a pixel circuit and a light-emitting element electrically connected to the pixel circuit. The pixel circuit includes a driving transistor and a photosensitive capacitor. The driving transistor is configured to provide a driving current to the light-emitting element; the photosensitive capacitor includes a first electrode electrically connected to a gate of the driving transistor; and a second electrode electrically connected to a first signal line. The first signal line is configured to transmit a first voltage signal; the first voltage signal is a constant voltage signal; the photosensitive capacitor has a first capacitance value under a first light intensity and a second capacitance value under a second light intensity; the first light intensity is less than the second light intensity; and the first capacitance value is less than the second capacitance value.

20 Claims, 7 Drawing Sheets

Cst1/Cst2

DISPLAY PANEL AND DISPLAY DEVICE

CROSS-REFERENCE TO RELATED APPLICATION

This application claims the priority of Chinese Patent Application No. 202411207637.8, filed on Aug. 29, 2024, the content of which is incorporated by reference in its entirety.

TECHNICAL FIELD

The present disclosure generally relates to the field of display technologies and, more particularly, relates to a display panel and a display device.

BACKGROUND

Organic light-emitting diode (OLED) display panels have the advantages of high visibility, high brightness and thinness; thus the applications of OLED display panels are becoming more and more extensive.

However, OLED display panels currently have problems with screen flickering and color cast under sunlight. The present disclosed display panels and display are direct to solve such a problem and other problems in the arts.

SUMMARY

One aspect of the present disclosure provides a display panel. The display panel includes a pixel circuit and a light-emitting element electrically connected to the pixel circuit. The pixel circuit includes a driving transistor and a photosensitive capacitor; the driving transistor is configured to provide a driving current to the light-emitting element; the photosensitive capacitor includes a first electrode and a second electrode; the first electrode is electrically connected to a gate of the driving transistor; the second electrode is electrically connected to a first signal line; the first signal line is configured to transmit a first voltage signal; the first voltage signal is a constant voltage signal; the photosensitive capacitor has a first capacitance value under a first light intensity and a second capacitance value under a second light intensity; the first light intensity is less than the second light intensity; and the first capacitance value is less than the second capacitance value.

Another aspect of the present disclosure includes a display device. The display device includes a display panel. The display panel includes a pixel circuit and a light-emitting element electrically connected to the pixel circuit. The pixel circuit includes a driving transistor and a photosensitive capacitor; the driving transistor is configured to provide a driving current to the light-emitting element; the photosensitive capacitor includes a first electrode and a second electrode; the first electrode is electrically connected to a gate of the driving transistor; the second electrode is electrically connected to a first signal line; the first signal line is configured to transmit a first voltage signal; the first voltage signal is a constant voltage signal; the photosensitive capacitor has a first capacitance value under a first light intensity and a second capacitance value under a second light intensity; the first light intensity is less than the second light intensity; and the first capacitance value is less than the second capacitance value.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings can also be obtained from these drawings without creative effort.

DETAILED DESCRIPTION

To enable people in the technical field to better understand the scheme of the present disclosure, the technical scheme in the embodiment of the present disclosure will be clearly and completely described below in conjunction with the drawings in the embodiment of the present disclosure. Obviously, the described embodiment is only a part of the embodiment of the present disclosure, not all of the embodiments. Based on the embodiments in the present disclosure, all other embodiments obtained by ordinary technicians in the field without creative work should belong to the scope of protection of the present disclosure.

It should be noted that the terms "first", and "second", etc. in the specification and claims of the present disclosure and the above-mentioned drawings are used to distinguish similar objects, and are not necessarily used to describe a specific order or sequence. It should be understood that the data used in this way can be interchangeable where appropriate, such that the embodiments of the present disclosure described here may be implemented in an order other than those illustrated or described here. In addition, the terms "including" and "having" and any variations thereof are intended to cover non-exclusive inclusions, for example, a process, method, system, product or device that includes a series of steps or units is not necessarily limited to those steps or units clearly listed, but may include other steps or units that are not clearly listed or inherent to these processes, methods, products or devices.

Figure 1:
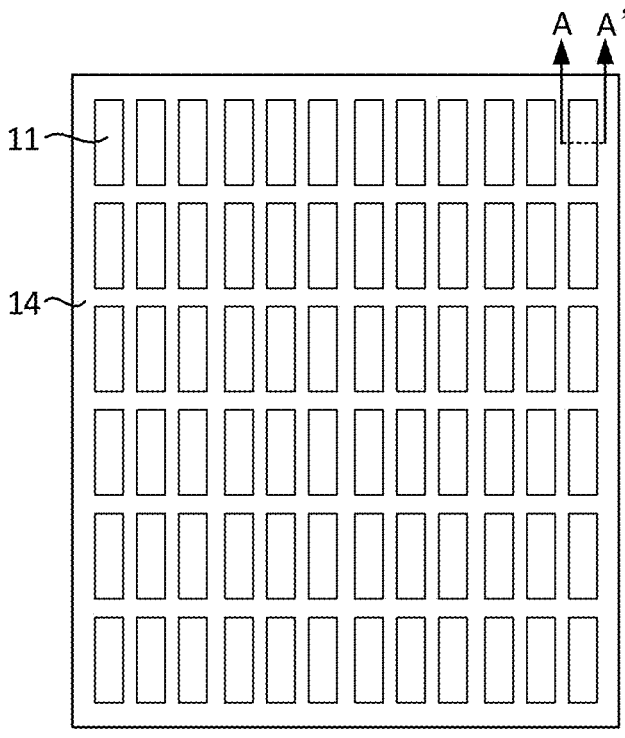
FIG. 1 illustrates an exemplary display panel according to various embodiments of the present disclosure.
Figure 2:
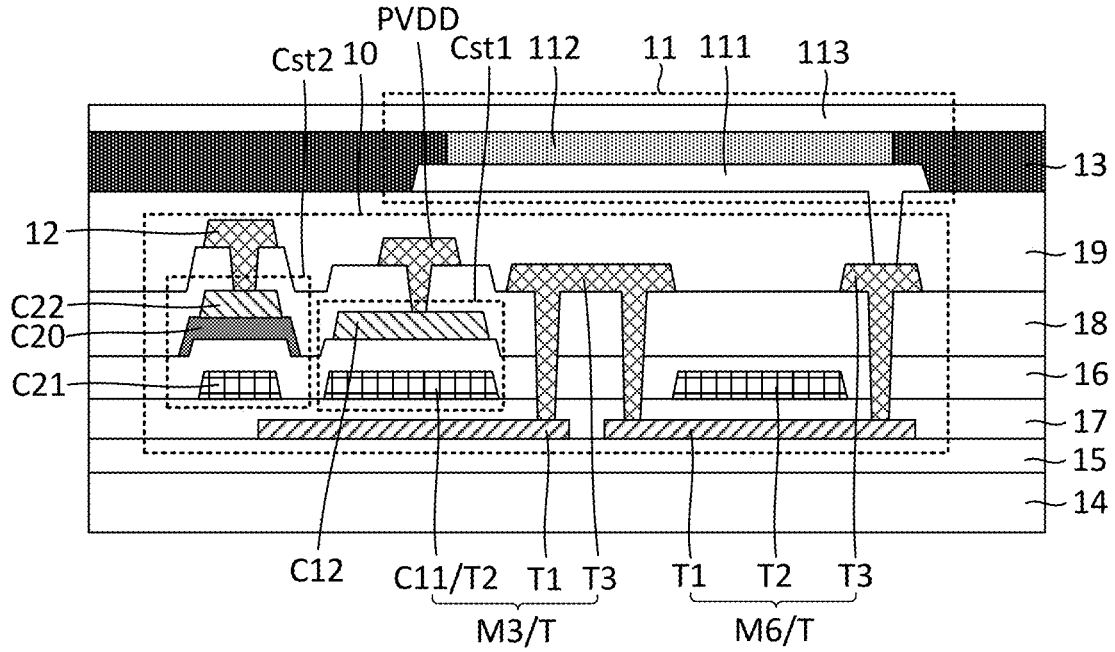
FIG. 2 illustrates an A-A'-sectional view of FIG. 1.
Figure 3:
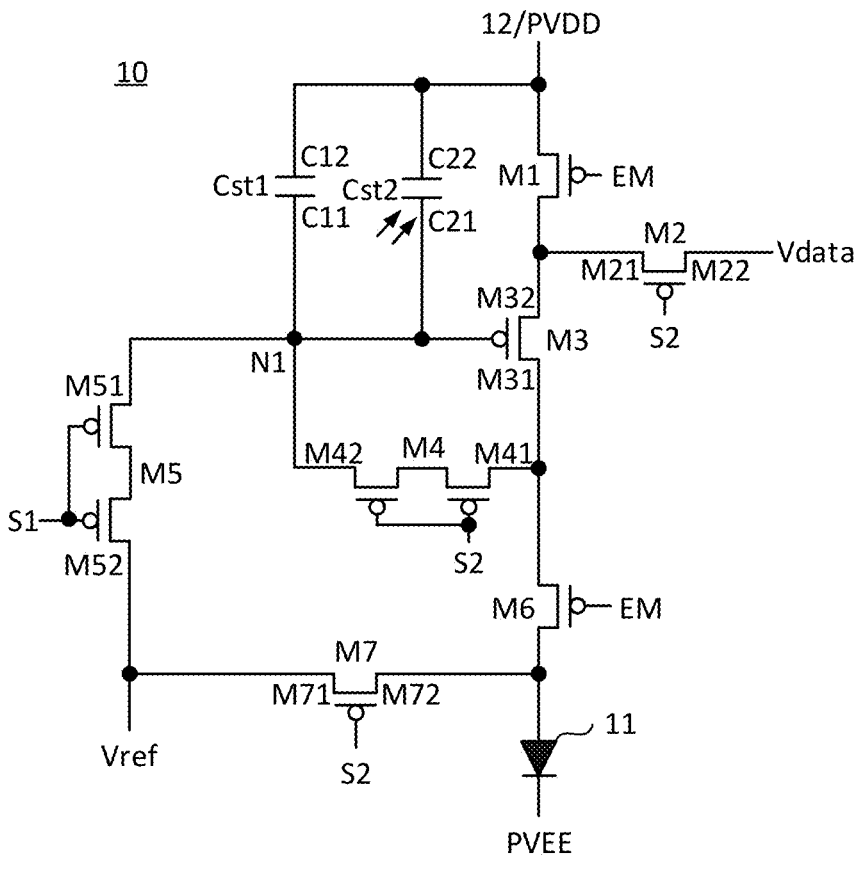
FIG. 3 illustrates an exemplary pixel circuit according to various embodiments of the present disclosure.

The present disclosure provides a display panel and a display device. FIG. 1 is a schematic diagram of an exemplary display panel provided by an embodiment of the present disclosure. FIG. 2 is a schematic diagram of an A-A'-sectional view of FIG. 1. FIG. 3 is a schematic diagram of an exemplary pixel circuit provided by an embodiment of the present disclosure.

As shown in FIG. 1-FIG. 3, the display panel provided by the embodiment of the present disclosure may include a pixel circuit 10 and a light-emitting element 11 electrically connected to the pixel circuit 10. The pixel circuit 10 may include a driving transistor M3 and a photosensitive capacitor Cst2. The driving transistor M3 may be used to provide a driving current to the light-emitting element 11. The photosensitive capacitor Cst2 may include a first electrode C21 and a second electrode C22. The first electrode C21 may be electrically connected to the gate of the driving transistor M3, and the second electrode C22 may be electrically connected to the first signal line 12. The first signal line 12 may be used to transmit a first voltage signal, and the first voltage signal may be a constant voltage signal. The photosensitive capacitor Cst2 may have a first capacitance value under a first light intensity, and the photosensitive capacitor Cst2 may have a second capacitance value under a second light intensity. The first light intensity may be less than the second light intensity, and the first capacitance value may be less than the second capacitance value.

The display panel provided in this embodiment may be an organic light-emitting diode (OLED) display panel. The display panel may also be other appropriate display panel.

As shown in FIG. 1 to FIG. 3, a plurality of pixel circuits 10 may be provided on the display panel. The arrangement of the pixel circuits 10 on the display panel may be an array arrangement but is not limited thereto.

As shown in FIG. 2, the pixel circuit 10 may be connected to a light-emitting element 11, and the light-emitting element 11 may be an organic light-emitting diode (OLED). The light-emitting element 11 may include an anode layer 111, a light-emitting layer 112 and a cathode layer 113 stacked together. When electrons and holes are injected from the cathode layer 113 and the anode layer 111 into the light-emitting layer 112, excitons may be formed in the light-emitting layer 112 and the light-emitting molecules may be excited such that the light-emitting layer 112 may emit visible light. Among them, by setting the light-emitting layer 112 to have different materials, it may be possible to emit visible light of different colors.

It should be noted that the light-emitting element 11 is not limited to an organic light emitting diode. In other embodiments, the light-emitting element 11 may also use other types of light-emitting devices, and the embodiment of the present disclosure does not specifically limit this.

Further, referring to FIG. 2, in one embodiment, the light-emitting layer 112 of each light-emitting element 11 may be separated by a pixel definition layer 13. The pixel definition layer 13 may include a plurality of openings, and at least a portion of the light-emitting layer 112 may be located in the opening. The area where the opening of the pixel definition layer 13 is located may be the light-emitting area of the light-emitting element 11.

Further, the light-emitting element 11 may include at least two light-emitting elements of different colors. For example, the light-emitting element 11 may include a red light-emitting element, a green light-emitting element and a blue light-emitting element to realize color image display.

The arrangement of the light-emitting element 11 on the display panel may be an array arrangement, but is not limited thereto.

In addition, the shape of the light-emitting area of the light-emitting element 11 may include but is not limited to the rectangle shown in FIG. 1. In other embodiments, the shape of the light-emitting area of the light-emitting element 11 may also be designed according to actual needs, and the embodiment of the present disclosure does not specifically limit this.

Further, the pixel circuit 10 may be electrically connected to the light-emitting element 11, and the pixel circuit 10 may be used to transmit the driving current to the light-emitting element 11 under the action of the signal of the driving signal line (such as a scan line, a data line, a voltage signal line, etc.) on the display panel to drive the light-emitting element 11 to emit light. Among them, the light-emitting element 11 and the pixel circuit 10 may be electrically connected thereto together to constitute the sub-pixel of the display panel, and multiple sub-pixels may be arranged according to a certain rule. By accurately controlling the brightness of different sub-pixels, the display of a complete image can be achieved.

As shown in FIG. 3, the pixel circuit 10 may include a driving transistor M3, and the driving transistor M3 and the light-emitting element 11 may be connected in series between the first power signal line PVDD and the second power signal line PVEE. The first power signal line PVDD may be used to transmit the first power voltage, and the second power signal line PVEE may be used to transmit the second power voltage. The first power voltage may be greater than the second power voltage.

The driving transistor M3 may be turned on according to the potential of its gate, and the driving current formed by its conduction may be used to drive the light-emitting element 11 to emit light. It can be understood that the driving transistor M3 may be used as a driving transistor, and its gate potential may determine the value of the driving current formed by its conduction. Accordingly, the brightness of the light-emitting element 11 may be adjusted by controlling the gate voltage of the driving transistor M3, thereby controlling the grayscale.

The driving current I generated by the driving transistor M3 may satisfy the following formula:

$$I = 1/2\ Cox\mu\ W/L\ (Vsg - |Vth|)^2$$

μ may be the carrier mobility of the driving transistor M3, W/L may be the width-to-length ratio of the channel of the driving transistor M3, Cox may be the gate oxide capacitance per unit area of the driving transistor M3, Vsg may be the voltage difference between the source and the gate of the driving transistor M3, and Vth may be the threshold voltage of the driving transistor M3.

It can be seen from the formula that the magnitude of the driving current I may be related to the threshold voltage Vth of the driving transistor M3, and the magnitude of the driving current I may determine the luminous brightness of the light-emitting element 11. Therefore, the magnitude of the threshold voltage Vth of the driving transistor M3 may affect the luminous brightness of the light-emitting element 11.

Further, referring to FIG. 3, in one embodiment, the pixel circuit 10 may further include a data writing transistor M2 and an additional transistor M4. The gate of the data writing transistor M2 may be electrically connected to the second scanning signal line S2, the first electrode M21 of the data writing transistor M2 may be electrically connected to the second electrode M32 of the driving transistor M3, and the second electrode M22 of the data writing transistor M2 may be electrically connected to the data signal line Vdata. The gate of the additional transistor M4 may be electrically connected to the second scanning signal line S2, the first electrode M41 of the additional transistor M4 may be electrically connected to the first electrode M31 of the driving transistor M3, and the second electrode M42 of the additional transistor M4 may be electrically connected to the gate of the driving transistor M3.

In the data writing stage, the second scanning signal on the second scanning signal line S2 may turn on the data writing transistor M2 and the additional transistor M4, and at the same time, the driving transistor M3 may also be in the on state, and the data signal provided by the data signal line Vdata may pass through the data writing transistor M2, the driving transistor M3 and the additional transistor M4, and may be applied to the gate of the driving transistor M3 (i.e., the first node N1), and the potential of the first node N1 may be gradually increased until the driving transistor M3 is turned off. When the driving transistor M3 is turned off, the gate potential of the driving transistor M3 may be VDATA–|Vth|. VDATA may be the voltage value of the data signal on the data signal line Vdata, and Vth may be the threshold voltage of the driving transistor M3.

After the data writing stage is over, the display panel may enter the light-emitting stage. In the light-emitting stage, the first power signal on the first power signal line PVDD may be transmitted to the second electrode M32 of the driving transistor M3, and the voltage difference between the second electrode M32 and the gate of the driving transistor M3 (i.e., Vsg) may be VPVDD–(VDATA–|Vth|). Accordingly, the driving current I generated by the driving transistor M3 may be $I=1/2Cox\mu W/L(Vsg-|Vth|)^2=1/2Cox\mu W/L(VPVDD-VDATA)^2$. VPVDD may be the voltage value of the first power signal on the first power signal line PVDD. In this way, the driving current generated by the driving transistor M3 may be independent of its own threshold voltage Vth.

However, when light is irradiated on the additional transistor M4, the additional transistor M4 may generate leakage current, causing the potential of the first node N1 connected to the additional transistor M4 to rise, thereby causing the driving current flowing through the light-emitting element 11 to decrease, and causing the light-emitting brightness of the light-emitting element 11 to decrease.

At the same time, due to the different materials of the light-emitting layers of the light-emitting elements 11 of different colors, in the first frame of the display panel where the brightness decreases due to light, the light-emitting elements 11 of different colors may have different degrees of brightness decrease, thereby causing color cast.

Based on the above technical problems, as shown in FIG. 3, in one embodiment, a photosensitive capacitor Cst2 may be provided in the pixel circuit 10. The first electrode C21 of the photosensitive capacitor Cst2 may be electrically connected to the gate M31 of the driving transistor M3, and the second electrode C22 of the photosensitive capacitor Cst2 may be electrically connected to the first signal line 12.

The first voltage signal transmitted on the first signal line 12 may be a constant voltage signal, that is, the voltage on the first signal line 12 may be a constant voltage. Accordingly, a constant voltage may be provided to the photosensitive capacitor Cst2.

As shown in FIG. 3, a photosensitive capacitor Cst2 may be connected in series between the gate M31 (i.e., the first node N1) of the driving transistor M3 and the first signal line 12. When the display panel is under a first light intensity with relatively weak light intensity, the photosensitive capacitor Cst2 may have a smaller first capacitance value. When the display panel is under a second light intensity with relatively strong light intensity, the photosensitive capacitor Cst2 may have a larger second capacitance value.

When the external light intensity increases, the leakage current generated by the additional transistor M4 under light illumination may also gradually increase, and the influence on the potential at the gate M31 (i.e., the first node N1) of the driving transistor M3may also gradually increase. In this embodiment, as the external light intensity increases, the capacitance value of the photosensitive capacitor Cst2 may also increase accordingly, and the ability of the photosensitive capacitor Cst2 to maintain the potential of the first node N1 may gradually increase. Therefore, when the external light intensity increases, the increase in the capacitance value of the photosensitive capacitor Cst2 may help to keep the potential of the first node N1 unchanged, and may reduce the decrease in the brightness of the first frame of the light-emitting element after being exposed to strong light. Accordingly, the brightness stability of the display panel may be better maintained under different lighting conditions, and the flickering problem may be solved.

At the same time, the brightness reduction degree of the display panel under strong light illumination may become smaller, which may also help to reduce the difference between the brightness reduction of light-emitting elements 11 of different colors in the first frame after being exposed to strong light, thereby reducing the color cast phenomenon.

It should be noted that the above-mentioned first illumination intensity, second illumination intensity, first capacitance value and second capacitance value may be reasonably set according to actual needs to ensure that the display panel may provide stable display quality and good user experience under different illumination conditions, and the embodiment of the present disclosure does not specifically limit this.

In summary, the display panel provided by the embodiments of the present disclosure may include a photosensitive capacitor connected in series between the gate of the driving transistor and the first signal line transmitting a constant voltage signal. When the display panel is under a first light intensity with a relatively weak light intensity, the photosensitive capacitor may have a relatively small first capacitance value; and when the display panel is under a second light intensity with a relatively strong light intensity, the photosensitive capacitor may have a relatively large second capacitance value. Accordingly, the capacitance value of the photosensitive capacitor may increase with the increase of the external light intensity. Accordingly, when the external light intensity increases, the capacitance value of the photosensitive capacitor may increase, and its ability to maintain the gate potential of the driving transistor may be enhanced, which may help to keep the gate potential of the driving transistor unchanged, and reduce the degree of decrease in the brightness of the first frame of the display panel when it is exposed to strong light, so as to better maintain the brightness stability of the display panel, reduce the flickering problem, and at the same time, it may also help to reduce the difference between the brightness decreases of light-emitting elements of different colors in the first frame after being exposed to strong light, thereby improving the color cast phenomenon.

Further, referring to FIG. 3, in one embodiment, the display panel may further include a first power signal line PVDD. The driving transistor M3 may be connected in series between the first power signal line PVDD and the light-emitting element 11, and the first signal line 12 and the first power signal line PVDD may be the same signal line.

Specifically, as shown in FIG. 3, the first current signal transmitted on the first power signal line PVDD may be a DC signal, not an AC signal. Accordingly, the first power signal line PVDD may provide a constant voltage for the photosensitive capacitor Cst2.

In one embodiment, by setting the first signal line 12 and the first power signal line PVDD as the same signal line, that is, the second electrode C22 of the photosensitive capacitor Cst2 may be directly electrically connected to the first power signal line PVDD, the number of signal lines may be reduced, the circuit structure may be simplified, and the cost may be reduced.

In one embodiment, the first light intensity and the second light intensity may be both greater than the preset light intensity threshold, the photosensitive capacitor Cst2 may have a constant capacitance value under the third light intensity. The third light intensity may be less than or equal to the preset light intensity threshold, and the constant capacitance value may be less than the first capacitance value.

Specifically, a light intensity value may be preset as a preset light intensity threshold, and the preset light intensity threshold may be used to distinguish between weak light and strong light conditions. The third light intensity may refer to the light intensity under weak light conditions, such as the light intensity indoors or in a cloudy environment. The first light intensity and the second light intensity may refer to the light intensity under strong light conditions, such as the light intensity under outdoor sunlight.

In one embodiment, when the display panel is under weak light conditions (for example, the light intensity is less than or equal to the preset light intensity threshold), the capacitance value of the photosensitive capacitor Cst2 may be a relatively small constant capacitance value, which may prevent the photosensitive capacitor Cst2 from coupling with other signals in the display panel and affecting the potential change speed of the gate voltage of the driving transistor M3, thereby preventing the photosensitive capacitor Cst2 from affecting the screen switching effect of the display panel under weak light conditions. At the same time, the capacitance value of the photosensitive capacitor Cst2 may be a constant capacitance value, which may ensure the brightness and color stability of the display panel under weak light conditions.

When the display panel is under strong light conditions (for example, the light intensity is greater than the preset light intensity threshold), the capacitance value of the photosensitive capacitor Cst2 may increase with the increase of the light intensity. At this time, the ability of the photosensitive capacitor Cst2 to maintain the gate potential of the driving transistor M3 (i.e., the first node N1) may be enhanced. Accordingly, when the additional transistor M4 is exposed to light and generates a large leakage current, the capacitance value of the photosensitive capacitor Cst2 may be increased to help keep the potential of the first node N1 unchanged, thereby reducing the decrease in the brightness of the first frame of the display panel after being exposed to strong light, and thus better maintaining the brightness stability of the display panel under strong light conditions, and reducing the screen flicker problem.

At the same time, the brightness decrease degree of the display panel under strong light irradiation may become smaller, which may also help to reduce the difference between the brightness decreases of the light-emitting elements 11 of different colors in the first frame after being exposed to strong light, thereby reducing the color cast phenomenon.

It should be noted that the above-mentioned preset light intensity threshold and constant capacitance value may be reasonably set according to actual needs to ensure that the display panel may provide stable display quality and good user experience under different lighting conditions, and the embodiment of the present disclosure does not specifically limit this. In one embodiment, the preset light intensity threshold is A, and 8000 lux≤A≤12000 lux.

As described above, when the light intensity of the display panel is less than or equal to the light intensity threshold A, the photosensitive capacitor Cst2 may have a smaller constant capacitance value to ensure the brightness and color stability of the display panel under weak light conditions. When the light intensity of the display panel is greater than the light intensity threshold A, the capacitance value of the photosensitive capacitor Cst2 may increase with the increase of the light intensity to better maintain the brightness stability of the display panel under strong light conditions and improve the flickering and color cast problems.

In one embodiment, the preset light intensity threshold A may be set to a value between 8000 lux and 12000 lux. On the one hand, it may avoid that the preset light intensity threshold A is set too small such that the capacitance value of the photosensitive capacitor Cst2 may also change under weak light conditions, thereby avoiding affecting the brightness and color stability of the display panel under weak light conditions. On the other hand, it may avoid that the preset light intensity threshold A is set too large such that the capacitance value of the photosensitive capacitor Cst2 may not respond to the change of light intensity under strong light conditions, thereby avoiding the inability to effectively improve the flickering screen and color deviation problems under strong light conditions. In one embodiment, the preset light intensity threshold A may be set to 10000 lux to effectively balance the display performance of the display panel under different light conditions, but it is not limited thereto.

Further, referring to FIG. 3, in one embodiment, the display panel may also include a first power signal line PVDD, and the driving transistor M3 may be connected in series between the first power signal line PVDD and the light-emitting element 11. The pixel circuit 10 may also include a storage capacitor Cst1. The storage capacitor Cst1 may include a third electrode C11 and a fourth electrode C12. The third electrode C11 may be electrically connected to the gate of the driving transistor M3, and the fourth electrode C12 may be electrically connected to the first power signal line PVDD. The constant capacitance value may be less than the capacitance value of the storage capacitor Cst1.

Specifically, as shown in FIG. 3, the driving transistor M3 and the light-emitting element 11 may be connected in series between the first power signal line PVDD and the second power signal line PVEE. The first power signal line PVDD may be configured to transmit the first power voltage, and the second power signal line PVEE may be configured to transmit the second power voltage, and the first power voltage may be greater than the second power voltage.

The storage capacitor Cst1 may be connected in series between the gate of the driving transistor M3 and the first power signal line PVDD. The storage capacitor Cst1 may store the gate voltage of the driving transistor M3 to maintain the potential stability of the first node N1.

In one embodiment, as shown in FIG. 3, the pixel circuit 10 may further include a reset transistor M5. A first electrode M51 of the reset transistor M5 may be electrically connected to the gate of the driving transistor M3, a second electrode M52 of the reset transistor M5 may be electrically connected to the reference signal line Vref, and the gate of the reset transistor M5 may be electrically connected to the first scanning signal line S1.

An exemplary driving process of the pixel circuit 10 may include the following stages.

In the initialization stage, the first scanning signal on the first scanning signal line S1 may turn on the reset transistor M5, and the reference voltage on the reference signal line Vref may be applied to the third electrode C11 of the storage capacitor Cst1 through the reset transistor M5, that is, the potential of the first node N1 may be the reference voltage to reset the first node N1, and at this time, the gate potential of the driving transistor M3 may also be the reference voltage.

In the data writing stage, the second scanning signal on the second scanning signal line S2 may turn on the data writing transistor M2 and the additional transistor M4. At this time, the potential of the gate of the driving transistor M3 may be the reference voltage, and the driving transistor M3 may also be turned on. The data signal on the data signal line Vdata may be applied to the first node N1 through the data writing transistor M2, the driving transistor M3 and the additional transistor M4, thereby writing the data signal into the storage capacitor Cst1.

In one embodiment, the constant capacitance value of the photosensitive capacitor Cst2 under the third light intensity may be set to be smaller than the capacitance value of the storage capacitor Cst1 such that the fixed capacitance value of the photosensitive capacitor Cst2 under weak light conditions may be smaller, which may reduce the coupling effect between the photosensitive capacitor Cst2 and other signals in the display panel under weak light conditions, thereby reducing the influence of the photosensitive capacitor Cst2 on the potential change speed of the gate voltage of the driving transistor M3, thereby avoiding the photosensitive capacitor Cst2 affecting the screen switching effect of the display panel under weak light conditions. In one embodiment, the constant capacitance value may be F1, the capacitance value of the storage capacitor may be F2, and F1≤F2/100.

By further setting the constant capacitance value of the photosensitive capacitor Cst2 under the third light intensity to be less than or equal to 1/100 of the capacitance value of the storage capacitor Cst1, the constant capacitance value of the photosensitive capacitor Cst2 under weak light conditions may be much smaller than the capacitance value of the storage capacitor Cst1. Under weak light conditions, the coupling effect between the photosensitive capacitor Cst2 and other signals in the display panel may be greatly reduced, and the photosensitive capacitor Cst2 may be prevented from coupling with other signals in the display panel to affect the potential change speed of the gate voltage of the driving transistor M3, thereby preventing the photosensitive capacitor Cst2 from affecting the screen switching effect of the display panel under weak light conditions.

Further, referring to FIG. 1 and FIG. 2, in one embodiment, the display panel may further include a substrate 14.

The photosensitive capacitor Cst2 may be located on one side of the substrate 14, and the photosensitive capacitor Cst2 may also include a photosensitive dielectric layer C20 located between the first electrode C21 and the second electrode C22. The first electrode C21, the photosensitive dielectric layer C20 and the second electrode C22 may be stacked on one side of the substrate 14. Along the thickness direction of the substrate 14, the first electrode C21, the photosensitive dielectric layer C20 and the second electrode C22 may have overlapping areas. Specifically, as shown in FIG. 2, the substrate 14 may provide support and structural foundation for the display panel.

The photosensitive capacitor Cst2 may be disposed on one side of the substrate 14, and the photosensitive capacitor Cst2 may include a first electrode C21, a photosensitive dielectric layer C20 and a second electrode C22 that are stacked. In the thickness direction of the substrate 14, the first electrode C21, the photosensitive dielectric layer C20 and the second electrode C22 may have overlapping areas to ensure the effective formation and functional realization of the photosensitive capacitor Cst2. By stacking the first electrode C21, the photosensitive dielectric layer C20 and the second electrode C22 on one side of the substrate 14, the space utilization rate of the display panel may be improved, and the design may be made more compact.

Further, the photosensitive dielectric layer C20 may be located between the first electrode C21 and the second electrode C22, and the material of the photosensitive dielectric layer C20 may be a photosensitive material. When light is irradiated on the photosensitive dielectric layer C20, the characteristics of the photosensitive dielectric layer C20 may change, thereby affecting the capacitance value of the photosensitive capacitor Cst2, and realizing the function that the capacitance value of the photosensitive capacitor Cst2 may change with the light intensity.

By designing the material of the photosensitive dielectric layer C20, the photosensitive capacitor Cst2 may have an expected capacitance value change under different light intensities. Designing the material of the photosensitive dielectric layer C20 may include selecting the material of the photosensitive dielectric layer C20, doping the photosensitive dielectric layer C20, selecting the doping material, and adjusting the doping ratio, etc., which are not specifically limited in the embodiment of the present disclosure.

Further, the capacitance value of the photosensitive capacitor Cst2 and its response characteristics to light may also be adjusted by adjusting the thickness of the photosensitive dielectric layer C20. For example, the smaller the thickness of the photosensitive dielectric layer C20, the larger the capacitance value of the photosensitive capacitor Cst2; and the larger the thickness of the photosensitive dielectric layer C20, the smaller the capacitance value of the photosensitive capacitor Cst2.

In another embodiment, a thinner photosensitive dielectric layer C20 may be more sensitive to light and may change the capacitance value faster; and a thicker photosensitive dielectric layer C20 may have better stability and durability. The embodiments of the present disclosure do not specifically limit the thickness of the photosensitive dielectric layer C20.

In one embodiment, the photosensitive dielectric layer C20 may have a first conductivity at a first light intensity, and the photosensitive dielectric layer may have a second conductivity at a second light intensity. The first conductivity may be less than the second conductivity.

When light is irradiated onto the photosensitive dielectric layer C20, based on the photoelectric effect of the photosensitive material, the energy of the photon may excite electrons, causing the conductivity of the photosensitive dielectric layer C20 to change, thereby causing the capacitance value of the photosensitive capacitor Cst2 to change.

In one embodiment, under a weaker first light intensity, the photosensitive dielectric layer C20 may have a lower first conductivity, thereby achieving a smaller first capacitance value for the photosensitive capacitor Cst2. Under a stronger second light intensity, the photosensitive dielectric layer C20 may have a higher second conductivity, thereby achieving a larger second capacitance value for the photosensitive capacitor Cst2.

In such a way, by setting the conductivity of the photosensitive dielectric layer C20 to increase with the increase of light intensity, the capacitance value of the photosensitive capacitor Cst2 may increase with the increase of light intensity. Accordingly, when the external light intensity increases, the capacitance value of the photosensitive capacitor Cst2 may increase, and its ability to maintain the gate potential of the driving transistor M3 may be enhanced, which may help to keep the gate potential of the driving transistor M3 unchanged, and reduce the degree of decrease in the brightness of the first frame of the display panel when it is exposed to strong light, better maintain the brightness stability of the display panel, improve the flickering problem, and at the same time, it may also help to reduce the difference between the brightness decreases of the light-emitting elements 11 of different colors in the first frame after being exposed to strong light, thereby improving the color cast phenomenon.

In one embodiment, the photosensitive dielectric layer C20 may have a first dielectric constant under the first light intensity, and the photosensitive dielectric layer C20 may have a second dielectric constant under the second light intensity. The first dielectric constant may be less than the second dielectric constant.

When light is irradiated onto the photosensitive dielectric layer C20, based on the photoelectric effect of the photosensitive material, the energy of the photon is absorbed, resulting in a change in the photogenerated carriers, thereby causing the dielectric constant of the photosensitive dielectric layer C20 to change, thereby causing the capacitance value of the photosensitive capacitor Cst2 to change.

In one embodiment, under a weaker first light intensity, the photosensitive dielectric layer C20 may have a lower first dielectric constant, thereby achieving a smaller first capacitance value for the photosensitive capacitor Cst2. Under a stronger second light intensity, the photosensitive dielectric layer C20 may have a higher second dielectric constant, thereby achieving a larger second capacitance value for the photosensitive capacitor Cst2.

In such a way, by setting the dielectric constant of the photosensitive dielectric layer C20 to increase with the increase of light intensity, the capacitance value of the photosensitive capacitor Cst2 may increase with the increase of light intensity such that when the external light intensity increases, the capacitance value of the photosensitive capacitor Cst2 may increase, and its ability to maintain the gate potential of the driving transistor M3 may be enhanced, which may help to keep the gate potential of the driving transistor M3 unchanged, and reduce the degree of decrease in the brightness of the first frame of the display panel when it is exposed to strong light, better maintain the brightness stability of the display panel, improve the flickering problem, and at the same time, it may also help to reduce the difference between the brightness decrease of the light-emitting elements 11 of different colors in the first frame after being exposed to strong light, thereby improving the color cast phenomenon.

In one embodiment, the material of the photosensitive dielectric layer C20 may include at least one of copper tungstate and titanium oxide. Copper tungstate ($CuWO4$) and titanium oxide ($TiO2$) are both semiconductor materials with good photosensitivity. When exposed to light, these two materials may change in conductivity, thereby affecting the dielectric constant.

In one embodiment, the photosensitive dielectric layer C20 may use at least one of copper tungstate ($CuWO4$) and titanium oxide ($TiO2$), which may achieve good photosensitivity and have a wide spectral response range. Accordingly, the photosensitive capacitor Cst2 may respond more sensitively to changes in light intensity.

Further, the performance of the photosensitive dielectric layer C20 may be further optimized by doping to help control the conductivity and dielectric constant of the photosensitive dielectric layer C20, thereby affecting the capacitance change of the photosensitive capacitor Cst2. Accordingly, the photosensitive capacitor Cst2 may have an expected capacitance change under different light intensities.

Further, referring to FIG. 2, in one embodiment, along the thickness direction of the substrate 14, the overlapping area of the first electrode C21, the photosensitive dielectric layer C20 and the second electrode C22 may be equal to the area of the first electrode C21. In another embodiment, the overlapping area of the first electrode C21, the photosensitive dielectric layer C20 and the second electrode C22 may be equal to the area of the second electrode C22.

Specifically, as shown in FIG. 2, the photosensitive dielectric layer C20 may completely cover the first electrode C21 and/or the second electrode C22 in the thickness direction of the substrate 14 such that the effective area of the photosensitive capacitor Cst2 may be maximized in the effective space, thereby achieving a greater capacitance change in a limited space. Accordingly, the capacitance change of the photosensitive capacitor Cst2 may better respond to changes in light intensity.

Figure 4:
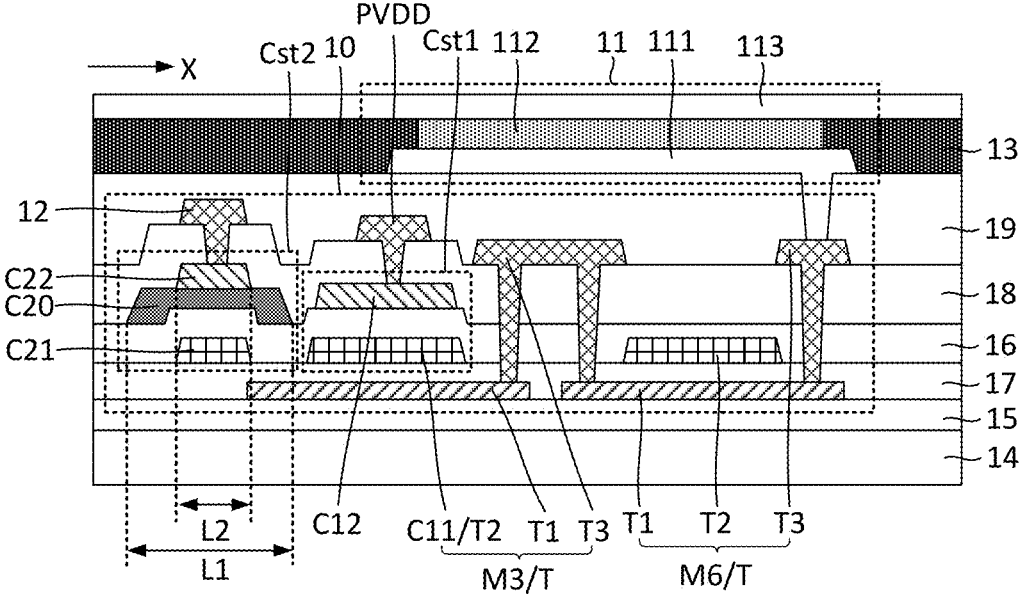
FIG. 4 illustrates a partial cross-sectional view of an exemplary display panel according to various embodiments of the present disclosure.

FIG. 4 is a schematic diagram of a partial cross-sectional structure of an exemplary display panel provided by an embodiment of the present disclosure. As shown in FIG. 4, in one embodiment, the length of the photosensitive dielectric layer C20 in the first direction X may be L1, the length of the second electrode C22 in the first direction X may be L2, and $L1>(3/2)\times L2$. The first direction X may be parallel to the plane where the substrate 14 is located.

Specifically, as shown in FIG. 4, by setting the length L1 of the photosensitive dielectric layer C20 in the first direction X to be at least 1.5 times the length L2 of the second electrode C22 in the first direction X, while satisfying that the photosensitive dielectric layer C20 completely covers the first electrode C21 and the second electrode C22 in the thickness direction of the substrate 14, the difficulty of alignment in the process may be reduced, making the process easier to implement, which may help to improve the yield and controllability of the process in the manufacturing process.

Further, referring to FIG. 2 and FIG. 4, in one embodiment, the driving transistor M3 may be connected in series between the first power signal line PVDD and the light-emitting element 11. The pixel circuit 10 may also include a storage capacitor Cst1, and the storage capacitor Cst1 may include a third electrode C11 and a fourth electrode C12. The third electrode C11 may be electrically connected to the gate of the driving transistor M3, and the fourth electrode C12 may be electrically connected to the first power signal line PVDD. The third electrode C11 and the fourth electrode C12 may be stacked and arranged on one side of the substrate 14, and the fourth electrode C12 may be located on the side of the third electrode C11 away from the substrate 14. Along the thickness direction of the substrate 14, the distance between the first electrode C21 and the second electrode C22 may be greater than the distance between the third electrode C11 and the fourth electrode C12.

The connection structure and function of the driving transistor M3, the first power signal line PVDD, the light-emitting element 11 and the storage capacitor Cst1 may refer to the above embodiments, and will not be repeated here.

As shown in FIG. 2 and FIG. 4, along the thickness direction of the substrate 14, the first power signal line PVDD may be arranged on the side of the storage capacitor Cst1 away from the substrate 14. Therefore, the fourth electrode C12 of the storage capacitor Cst1 may be arranged on the side of the third electrode C11 away from the substrate 14, which may facilitate the connection between the fourth electrode C12 of the storage capacitor Cst1 and the first power signal line PVDD.

Further, referring to FIG. 2 and FIG. 4, in one embodiment, when the first signal line 12 and the first power signal line PVDD are a same signal line, or when the first signal line 12 and the first power signal line PVDD are electrically connected, the second electrode C22 of the photosensitive capacitor Cst2 may be arranged on the side of the first electrode C21 away from the substrate 14, which may facilitate the electrical connection between the second electrode C22 of the photosensitive capacitor Cst2 and the first power signal line PVDD.

Further, as shown in FIG. 2 and FIG. 4, along the thickness direction of the substrate 14, the spacing between the first electrode C21 and the second electrode C22 may be set to be greater than the spacing between the third electrode C11 and the fourth electrode C12 such that the constant capacitance value of the photosensitive capacitor Cst2 may be smaller than the capacitance value of the storage capacitor Cst1, thereby realizing that the constant capacitance value of the photosensitive capacitor Cst2 may be smaller under weak light conditions, reducing the coupling effect between the photosensitive capacitor Cst2 and other signals in the display panel under weak light conditions, avoiding the photosensitive capacitor Cst2 from coupling with other signals in the display panel to affect the potential change speed of the gate voltage of the driving transistor M3, and thus avoiding the photosensitive capacitor Cst2 from affecting the screen switching effect of the display panel under weak light conditions.

The thickness of the film layer between the first electrode C21 and the second electrode C22 may be increased to achieve that the spacing between the first electrode C21 and the second electrode C22 is greater than the spacing between the third electrode C11 and the fourth electrode C12.

In one embodiment, as shown in FIG. 2 and FIG. 4, there may be a first interlayer insulation layer 16 between the third electrode C11 and the fourth electrode C12 of the storage capacitor Cst1. The first interlayer insulation layer 16 may be an insulation layer provided as a whole layer. Along the thickness direction of the substrate 14, the first electrode C21 and the second electrode C22 of the photosensitive capacitor Cst2 may be respectively located on both sides of the first interlayer insulation layer 16, and on the basis of the first interlayer insulation layer 16, a photosensitive dielectric layer C20 may be further provided between the first electrode C21 and the second electrode C22 such that the spacing between the first electrode C21 and the second electrode C22 may be greater than the spacing between the third electrode C11 and the fourth electrode C12. Accordingly, the constant capacitance value of the photosensitive capacitor Cst2 may be smaller than the capacitance value of the storage capacitor Cst1.

In other embodiments, the film layer positions of the first electrode C21 and the second electrode C22 may also be adjusted to achieve a spacing between the first electrode C21 and the second electrode C22 to be greater than the spacing between the third electrode C11 and the fourth electrode C12.

Figure 5:
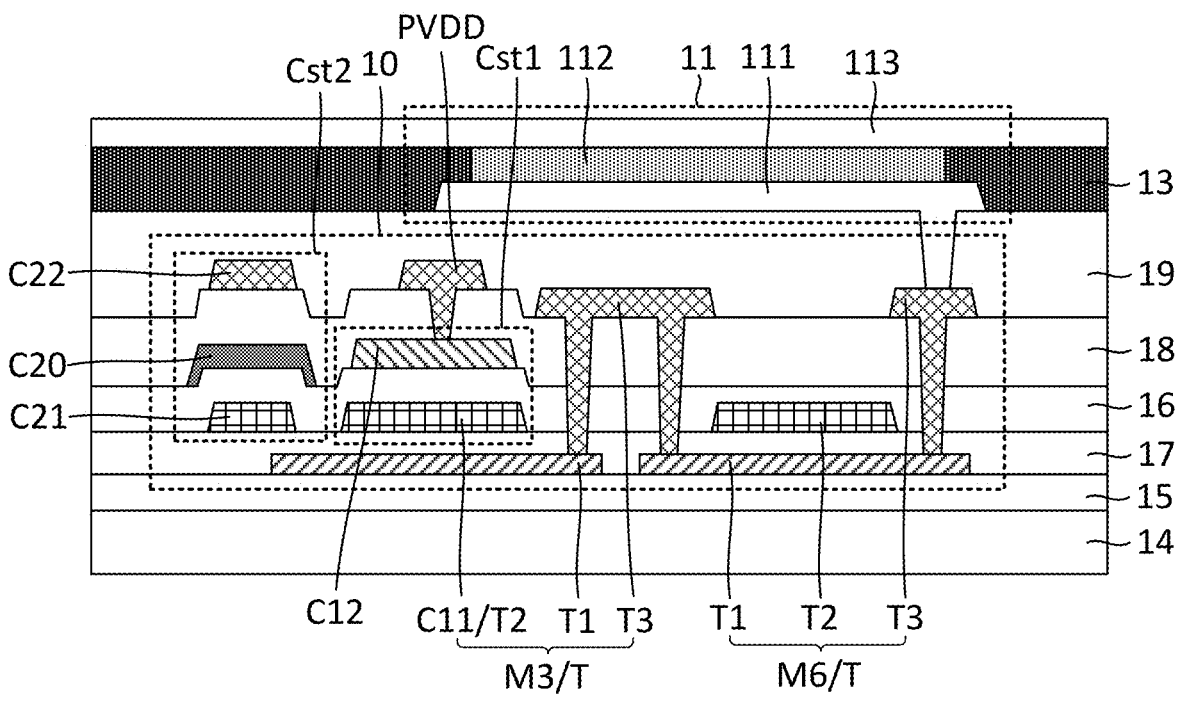
FIG. 5 illustrates a partial cross-sectional view of another exemplary display panel according to various embodiments of the present disclosure.

For example, FIG. 5 is a schematic diagram of a partial cross-sectional structure of another exemplary display panel provided by an embodiment of the present disclosure. As shown in FIG. 5, taking the first electrode C21 of the photosensitive capacitor Cst2 and the third electrode C11 of the storage capacitor Cst1 being located in a same film layer as an example, the second electrode C22 of the photosensitive capacitor Cst2 may be arranged on the side of the fourth electrode C12 of the storage capacitor Cst1 away from the substrate 14 along the thickness direction of the substrate 14. For example, the second electrode C22 of the photosensitive capacitor Cst2 and the first power signal line PVDD may be arranged in the same film layer such that the spacing between the first electrode C21 and the second electrode C22 may be greater than the spacing between the third electrode C11 and the fourth electrode C12, thereby realizing that the constant capacitance value of the photosensitive capacitor Cst2 may be smaller than the capacitance value of the storage capacitor Cst1.

It should be noted that the specific film layer positions of the first electrode C21 and the second electrode C22 of the photosensitive capacitor Cst2, and the film layer structure between the first electrode C21 and the second electrode C22 are not limited to the above-mentioned embodiments, and the embodiments of the present disclosure does not specifically limit this.

Further, referring to FIG. 2, FIG. 4 and FIG. 5, in one embodiment, along the thickness direction of the substrate 14, the first electrode C21 may be located on the side of the fourth electrode C12 adjacent to the substrate 14.

If the photosensitive capacitor Cst2 is too close to the light-exiting surface of the display panel, the external light may directly irradiate the photosensitive capacitor Cst2, the photosensitive capacitor Cst2 may be too sensitive to the external light intensity, resulting in the capacitance value of the photosensitive capacitor Cst2 being easily changed in a weak light environment, which may not be conducive to ensuring the brightness and color stability of the display panel under weak light conditions.

In one embodiment, by setting the first electrode C21 of the photosensitive capacitor Cst2 on the side of the fourth electrode C12 of the storage capacitor Cst1 adjacent to the substrate 14, the photosensitive capacitor Cst2 may be far away from the light-exiting surface of the display panel. Accordingly, the sensitivity of the photosensitive capacitor Cst2 to the light intensity response may be in a suitable range, avoiding the capacitance value of the photosensitive capacitor Cst2 from changing in a weak light environment, and ensuring the brightness and color stability of the display panel under weak light conditions.

Further, referring to FIG. 2-FIG. 5, in one embodiment, the pixel circuit 10 may include at least one thin-film transistor T including the driving transistor M3. The thin-film transistor T may include an active layer T1, a gate T2, and a source/drain electrode T3 stacked on one side of the substrate 14.

In this embodiment, the first electrode C21 of the photosensitive capacitor Cst2 may be located in the same film layer as the gate T2, or the first electrode C21 of the photosensitive capacitor Cst2 may be located in the film layer on the side of the gate T2 adjacent to the substrate 14. Thus, the photosensitive capacitor Cst2 may be relatively further away from the light-exiting surface of the display panel, avoiding the capacitance value of the photosensitive capacitor Cst2 from changing in a weak light environment, and ensuring the brightness and color stability of the display panel under weak light conditions.

Further, after determining the film layer position of the first electrode C21 of the photosensitive capacitor Cst2, the film layer position of the second electrode C22 may be determined according to the film layer position of the first electrode C21 and the required spacing between the first electrode C21 and the second electrode C22, and the embodiment of the present disclosure does not specifically limit this.

Further, referring to FIGS. 2-5, in one embodiment, the driving transistor M3 may be connected in series between the first power signal line PVDD and the light-emitting element 11. The pixel circuit 10 may also include a storage capacitor Cst1, which may include a third electrode C11 and a fourth electrode C12. The third electrode C11 may be electrically connected to the gate of the driving transistor M3, and the fourth electrode C12 may be electrically connected to the first power signal line PVDD. The third electrode C11 and the fourth electrode C12 may be stacked on one side of the substrate 14, and the fourth electrode C12 may be located on the side of the third electrode C11 away from the substrate 14. Along the thickness direction of the substrate 14, the overlapping area between the first electrode C21 and the second electrode C22 may be S1, the overlapping area between the third electrode C11 and the fourth electrode C12 may be S2, and S1<S2.

The specific structure and function of the driving transistor M3, the first power signal line PVDD, the light-emitting element 11 and the storage capacitor Cst1 may refer to the above embodiment, which will not be repeated here.

In one embodiment, as shown in FIG. 2-FIG. 5, along the thickness direction of the substrate 14, the overlapping area S1 between the first electrode C21 and the second electrode C22 may be set to be smaller than the overlapping area S2 between the third electrode C11 and the fourth electrode C12 such that the size of the photosensitive capacitor Cst2 may be smaller than the size of the storage capacitor Cst1 to achieve that the constant capacitance value of the photosensitive capacitor Cst2 may be smaller than the capacitance value of the storage capacitor Cst1. In this way, the constant capacitance value of the photosensitive capacitor Cst2 under weak light conditions may be smaller, which may reduce the coupling effect between the photosensitive capacitor Cst2 and other signals in the display panel under weak light conditions, avoid the photosensitive capacitor Cst2 coupling with other signals in the display panel to affect the potential change speed of the gate voltage of the driving transistor M3, and thus avoid the photosensitive capacitor Cst2 affecting the screen switching effect of the display panel under weak light conditions.

Further, $5 \times S1 \le S2 \le 10 \times S1$. Along the thickness direction of the substrate 14, the overlapping area S2 between the third electrode C11 and the fourth electrode C12 may be set to be 5 to 10 times the overlapping area S1 between the first electrode C21 and the second electrode C22 such that the size of the storage capacitor Cst1 may be 5 to 10 times the size of the photosensitive capacitor Cst2. While meeting the requirement that the capacitance value of the photosensitive capacitor Cst2 changes with the light intensity, it may ensure that the constant capacitance value of the photosensitive capacitor Cst2 under weak light conditions may be small enough to reduce the coupling effect between the photosensitive capacitor Cst2 and other signals in the display panel under weak light conditions, avoid the photosensitive capacitor Cst2 coupling with other signals in the display panel to affect the potential change speed of the gate voltage of the driving transistor M3, and thus avoid the photosensitive capacitor Cst2 affecting the screen switching effect of the display panel under weak light conditions. At the same time, the photosensitive capacitor Cst2 may have a smaller size to reduce its occupied space, which may be helpful to achieve a more compact pixel design such that the display panel can support a higher resolution.

Further, referring to FIG. 2-FIG. 5, in one embodiment, the driving transistor M3 may be connected in series between the first power signal line PVDD and the light-emitting element 11. The pixel circuit 10 may also include a storage capacitor Cst1, and the storage capacitor Cst1 may include a third electrode C11 and a fourth electrode C12. The third electrode C11 may be electrically connected to the gate of the driving transistor M3, and the fourth electrode C12 may be electrically connected to the first power signal line PVDD. The third electrode C11 and the fourth electrode C12 may be stacked on one side of the substrate 14, and the fourth electrode C12 may be located on the side of the third electrode C11 away from the substrate 14. The first electrode C21 and the third electrode C11 may be located in the same film layer, and/or the second electrode C22 and the fourth electrode C12 may be located in the same film layer.

The specific structures and functions of the driving transistor M3, the first power signal line PVDD, the light-emitting element 11 and the storage capacitor Cst1 may refer to the above embodiments, and will not be repeated here.

In one embodiment, as shown in FIG. 2, FIG. 4 and FIG. 5, the first electrode C21 of the photosensitive capacitor Cst2 and the third electrode C11 of the storage capacitor Cst1 may be located in the same film layer such that the setting of one metal layer may be reduced, thereby achieving the purpose of reducing production costs and reducing the thickness of the display panel. At the same time, the first electrode C21 may use the same material as the third electrode C11 such that the first electrode C21 and the third electrode C11 may be prepared in the same process, thereby shortening the process time.

Further, referring to FIG. 2, FIG. 4 and FIG. 5, the second electrode C22 of the photosensitive capacitor Cst2 and the fourth electrode C12 of the storage capacitor Cst1 may be located in the same film layer to reduce the setting of one metal layer, thereby achieving the purpose of reducing production costs and reducing the thickness of the display panel. At the same time, the same material as the third electrode C11 may be used. Accordingly, the first electrode C21 and the third electrode C11 may be prepared in the same process, thereby shortening the process time.

It should be noted that, as shown in FIG. 2, FIG. 4 and FIG. 5, there may be a first interlayer insulation layer 16 between the third electrode C11 and the fourth electrode C12 of the storage capacitor Cst1. The first interlayer insulation layer 16 may be an insulation layer laid in a whole layer. Accordingly, when preparing the first interlayer insulation layer 16, there may be no need to perform a separate patterning process on the first interlayer insulation layer 16, which may simplify the preparation process and improve production efficiency.

At this time, as shown in FIG. 2, FIG. 4 and FIG. 5, the first electrode C21 and the second electrode C22 of the photosensitive capacitor Cst2 may include a first interlayer insulation layer 16 and a photosensitive dielectric layer C20 stacked between them. Accordingly, the spacing between the first electrode C21 and the second electrode C22 may be greater than the spacing between the third electrode C11 and the fourth electrode C12. Accordingly, the constant capacitance value of the photosensitive capacitor Cst2 may be smaller than the capacitance value of the storage capacitor Cst1, which may be beneficial to reduce the coupling effect between the photosensitive capacitor Cst2 and other signals in the display panel under weak light conditions, avoid the photosensitive capacitor Cst2 coupling with other signals in the display panel to affect the potential change speed of the gate voltage of the driving transistor M3, and further avoid the photosensitive capacitor Cst2 affecting the screen switching effect of the display panel under weak light conditions.

Figure 6:
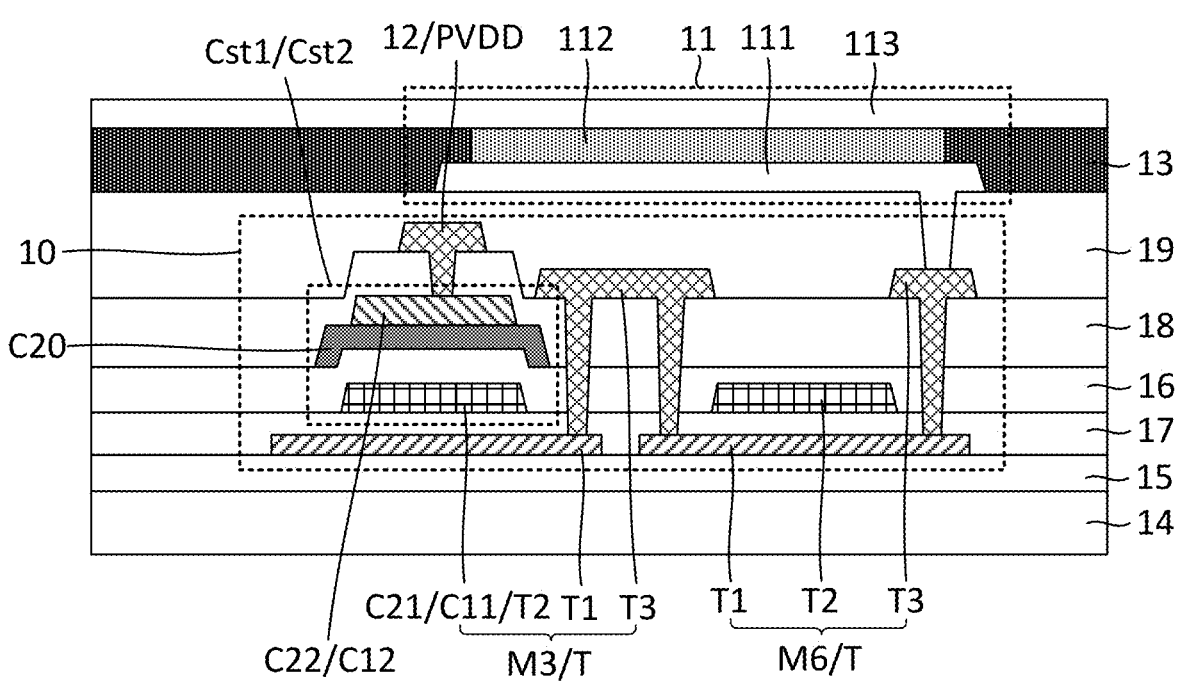
FIG. 6 illustrates a partial cross-sectional view of another exemplary display panel according to various embodiments of the present disclosure.

FIG. 6 is a schematic diagram of a partial cross-sectional structure of another exemplary display panel provided in an embodiment of the disclosure. As shown in FIG. 6, in one embodiment, the driving transistor M3 may be connected in series between the first power signal line PVDD and the light-emitting element 11. The pixel circuit 10 may also include a storage capacitor Cst1. The storage capacitor may include a third electrode C11 and a fourth electrode C12. The third electrode C11 may be electrically connected to the gate of the driving transistor M3, and the fourth electrode C12 may be electrically connected to the first power signal line PVDD. The third electrode C11 and the fourth electrode C12 may be stacked on one side of the substrate 14, and the fourth electrode C12 may be located on the side of the third electrode C11 away from the substrate 14. The first electrode C21 and the third electrode C11 may be a same plate, and the second electrode C22 and the fourth electrode C12 may be a same plate.

The specific structure and function of the driving transistor M3, the first power signal line PVDD, the light-emitting element 11 and the storage capacitor Cst1 may refer to the above embodiment, which will not be repeated here.

In one embodiment, as shown in FIG. 6, the third electrode C11 of the storage capacitor Cst1 may be used as the first electrode C21 of the photosensitive capacitor Cst2, and the fourth electrode C12 of the storage capacitor Cst1 may be used as the second electrode C22 of the photosensitive capacitor Cst2 such that the storage capacitor Cst1 may be reused as the photosensitive capacitor Cst2. At this time, it may be only necessary to add a photosensitive dielectric layer C20 between the third electrode C11 and the fourth electrode C12 of the storage capacitor Cst1 such that the storage capacitor Cst1 may realize the function of the photosensitive capacitor Cst2, which may be conducive to simplifying the circuit structure and manufacturing process.

Further, referring to FIG. 2-FIG. 5, because the size and structure of the storage capacitor Cst1 may be fixed, in other embodiments, the photosensitive capacitor Cst2 may also be set as a capacitor structure independent of the storage capacitor Cst1, thereby increasing the structural design space of the photosensitive capacitor Cst2, which may be conducive to achieving ideal photosensitivity characteristics.

Figure 7:
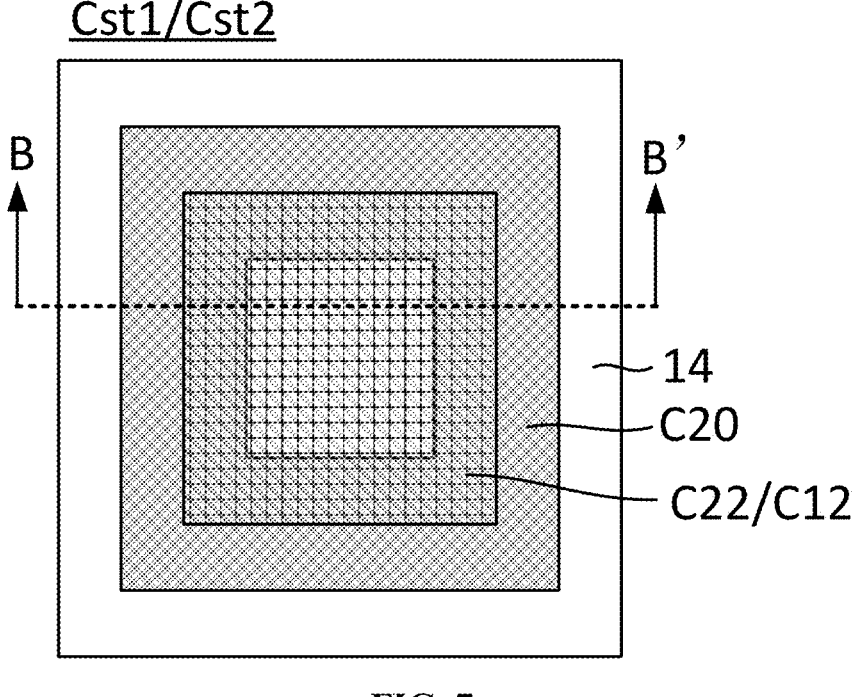
FIG. 7 illustrates an exemplary photosensitive capacitor according to various embodiments of the present disclosure.
Figure 8:
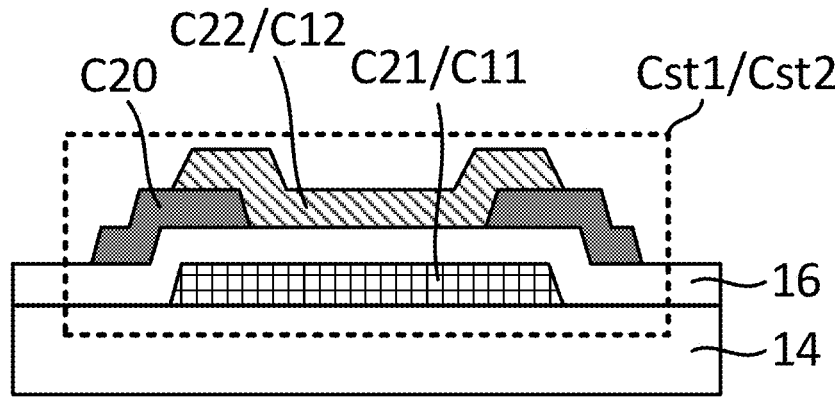
FIG. 8 illustrates a B-B'-sectional view of FIG. 7.

FIG. 7 is a schematic diagram of the structure of an exemplary photosensitive capacitor provided by an embodiment of the present disclosure, and FIG. 8 is a schematic diagram of the cross-sectional structure of FIG. 7 along the B-B' direction. As shown in FIG. 7 and FIG. 8, in one embodiment, in the direction perpendicular to the display panel, the photosensitive dielectric layer C20 may cover at least a portion of the edge of the fourth electrode C12.

Specifically, as shown in FIG. 7 and FIG. 8, when the storage capacitor Cst1 is reused as the photosensitive capacitor Cst2, because the storage capacitor Cst1 may usually have a large size, along the direction perpendicular to the plane where the display panel is located, that is, the thickness direction of the substrate 14, the photosensitive dielectric layer C20 may be locally set in the overlapping area between the third electrode C11 and the fourth electrode C12 of the storage capacitor Cst1 to realize the function of the photosensitive capacitor Cst2 without significantly affecting the size and performance of the storage capacitor Cst1.

In the direction perpendicular to the plane where the display panel is located, the photosensitive dielectric layer C20 may cover at least a portion of the edge of the fourth electrode C12, or in other words, the photosensitive dielectric layer C20 may be arranged at the edge of the fourth electrode C12 to prevent the external light from being completely blocked by the fourth electrode C12 and unable to irradiate the photosensitive dielectric layer C20, thereby ensuring that the photosensitive dielectric layer C20 may receive enough external light such that the photosensitive capacitor Cst2 may have an ideal sensitivity to the external light intensity.

Further, referring to FIGS. 7-8, in one embodiment, in the direction parallel to the plane where the display panel is located, the edge of the photosensitive dielectric layer C20 may exceed the edge of the fourth electrode C12 such that, in the thickness direction of the substrate 14, at least a portion of the photosensitive dielectric layer C20 may not be blocked by the fourth electrode C12, thereby ensuring that the photosensitive dielectric layer C20 may receive enough external light such that the photosensitive capacitor Cst2 may have an ideal sensitivity to the external light intensity.

Further, as shown in FIG. 7-FIG. 8, the shape of the photosensitive dielectric layer C20 may be annular. In the thickness direction of the substrate 14, the photosensitive dielectric layer C20 may cover the edge of the fourth electrode C12 such that the area of the photosensitive dielectric layer C20 may meet the ideal photosensitivity requirements, while preventing the external light from being completely blocked by the fourth electrode C12 and unable to irradiate the photosensitive dielectric layer C20, thereby ensuring that the photosensitive dielectric layer C20 may receive enough external light to realize the photosensitive function of the photosensitive capacitor Cst2.

The shape and specific setting range of the photosensitive dielectric layer C20 may be set according to actual needs, and the embodiment of the present disclosure does not specifically limit this.

Further, referring to FIG. 2, FIG. 4 and FIG. 5, in one embodiment, along the thickness direction of the substrate 14, the first electrode C21 and the gate T2 of the driving transistor M3 may not have an overlapping area, and the second electrode C22 and the gate T2 of the driving transistor M3 may not have an overlapping area.

As shown in FIG. 2, FIG. 4 and FIG. 5, when the storage capacitor Cst1 is not reused as the photosensitive capacitor Cst2, that is, when the photosensitive capacitor Cst2 is a capacitor structure independent of the storage capacitor Cst1, along the thickness direction of the substrate 14, the first electrode C21 and the second electrode C22 of the photosensitive capacitor Cst2 may be arranged not to form an overlapping area with the gate T2 of the driving transistor M3 to avoid the photosensitive capacitor Cst2 interfering with the operation of the driving transistor M3, thereby ensuring the normal operation of the driving transistor M3 and improving the stability of the display panel.

Figure 9:
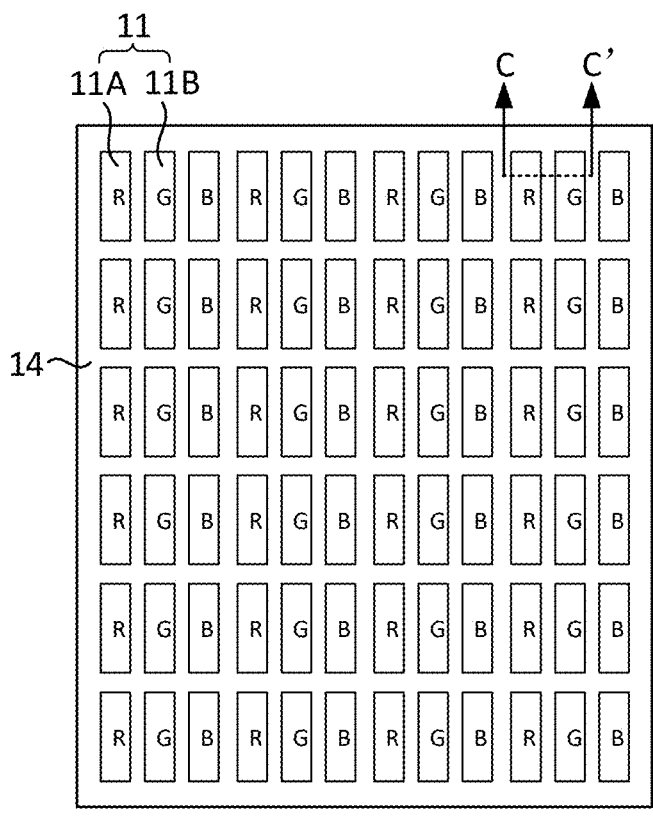
FIG. 9 illustrates another exemplary display panel according to various embodiments of the present disclosure.
Figure 10:
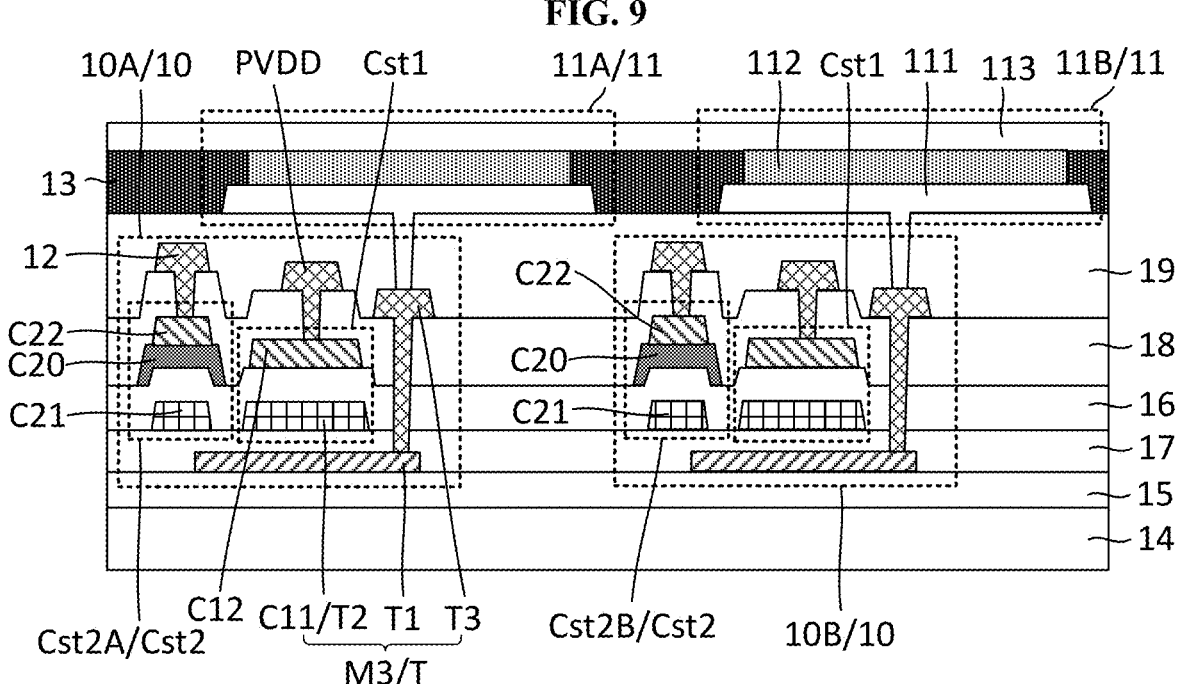
FIG. 10 illustrates a C-C'-sectional view of FIG. 9.

FIG. 9 is a schematic diagram of the structure of another exemplary display panel provided by an embodiment of the present disclosure, and FIG. 10 is a schematic diagram of the cross-sectional structure of FIG. 9 along the C-C' direction. As shown in FIG. 9 and FIG. 10, in one embodiment, the pixel circuit 10 may include a first pixel circuit 10A and a second pixel circuit 10B, and the light-emitting element 11 may include a first light-emitting element 11A and a second light-emitting element 11B. The first pixel circuit 10A may be electrically connected to the first light-emitting element 11A, and the second pixel circuit 10B may be electrically connected to the second light-emitting element 11B. The first light-emitting element 11A and the second light-emitting element 11B may have different light-emitting colors. The photosensitive capacitor Cst2 in the first pixel circuit 10A may be the first photosensitive capacitor Cst2A, and the photosensitive capacitor Cst2 in the second pixel circuit 10B may be the second photosensitive capacitor Cst2B. The first capacitance value of the first photosensitive capacitor Cst2A may be different from the first capacitance value of the second photosensitive capacitor Cst2B, and/or the second capacitance value of the first photosensitive capacitor Cst2A may be different from the second capacitance value of the second photosensitive capacitor Cst2B.

Specifically, as shown in FIG. 9 and FIG. 10, the light-emitting element 11 may include at least two light-emitting elements of different colors. For example, the light-emitting element 11 may include a red light-emitting element R, a green light-emitting element G, and a blue light-emitting element B to realize color image display, but is not limited thereto.

In one embodiment, the light-emitting element 11 may include a first light-emitting element 11A and a second light-emitting element 11B that emit light of different colors. The pixel circuit 10 connected to the first light-emitting element 11A may be a first pixel circuit 10A, and the first pixel circuit 10A may be used to drive the first light-emitting element 11A to emit light. The pixel circuit 10 connected to the second light-emitting element 11B may be a second pixel circuit 10B, and the second pixel circuit 10B may be used to drive the second light-emitting element 11B to emit light. In such a way, the sub-pixel formed by the first light-emitting element 11A and the first pixel circuit 10A and the sub-pixel formed by the second light-emitting element 11B and the second pixel circuit 10B may be sub-pixels of different colors.

The first light-emitting element 11A may be any one of a red light-emitting element R, a green light-emitting element G and a blue light-emitting element B. The second light-emitting element 11B may be any one of a red light-emitting element R, a green light-emitting element G and a blue light-emitting element B. The first light-emitting element 11A and the second light-emitting element 11B may have different light-emitting colors. The embodiments of the present disclosure do not specifically limit the light-emitting colors of the first light-emitting element 11A and the second light-emitting element 11B.

Further, a plurality of drive signal lines (such as scan lines, data lines, voltage signal lines, etc.) may be provided in the display panel, and the drive signal lines may usually be metal wirings, which may shield the thin-film transistor T and reduce the influence of external light on the thin-film transistor T. At the same time, a light-shielding metal layer may be additionally provided in the display panel to further reduce the influence of external light on the thin-film transistor T.

However, it has been found that, due to the manufacturing process requirements and transmittance requirements of the display panel, the above-mentioned metal wiring and light-shielding metal layer may not completely shield the thin-film transistor T. When the incident angle of light is large, or the light intensity is too large, light may still irradiate the thin-film transistor T. At the same time, the thin-film transistor T may be usually provided with a bottom metal layer on the side adjacent to the substrate 14. The reflection of the bottom metal layer on the external light may also cause a portion of the light to irradiate the thin-film transistor T, thereby causing the thin-film transistor T to generate leakage current. Therefore, it may be impossible to completely prevent the thin-film transistor T from being affected by light, which may cause the brightness of the display panel to decrease in the first frame of light.

At the same time, due to layout design reasons, the sizes and arrangements of sub-pixels of different colors may be different, resulting in different degrees of shielding of the thin-film transistors T in sub-pixels of different colors by the above-mentioned metal wiring and shading metal layer. Under strong light conditions, the thin-film transistors T in sub-pixels of different colors may receive different amounts of light, and the leakage currents generated by the thin-film transistors T in sub-pixels of different colors may be different. As a result, the brightness reduction degrees of sub-pixels of different colors in the first frame after being exposed to strong light may be different, resulting in the problem of color cast of the display panel under strong light conditions.

In one embodiment of the present disclosure, the first capacitance value of the first photosensitive capacitor Cst2A in the first pixel circuit 10A may be set to be different from the first capacitance value of the second photosensitive capacitor Cst2B in the second pixel circuit 10B, and/or the second capacitance value of the first photosensitive capacitor Cst2A in the first pixel circuit 10A may be set to be different from the second capacitance value of the second photosensitive capacitor Cst2B in the second pixel circuit 10B to adjust the first capacitance values of the photosensitive capacitors Cst2 in the sub-pixels of different colors under the first light intensity to be different, and/or the second capacitance values under the second light intensity to be different such that the photosensitive capacitors Cst2 in the sub-pixels of different colors may have different first capacitance values under the first light intensity. The photosensitive capacitor Cst2 in different color sub-pixels may have different capacitance values under the same light intensity. Thus, the ability to maintain the gate potential of the driving transistor M3 under the same light intensity may be different. Therefore, the difference in the amount of light received by the thin-film transistor T in the sub-pixels of different colors may be balanced by adjusting the capacitance value of the photosensitive capacitor Cst2 in the sub-pixels of different colors. The greater the amount of light received by the thin-film transistor T in the sub-pixel, the greater the capacitance value of its photosensitive capacitor Cst2, and vice versa. In this way, the difference in the brightness change of the first frame of the sub-pixels of different colors under strong light conditions may be reduced, and the color cast problem of the display panel under strong light may be reduced.

In one embodiment, the degree to which the thin-film transistors T in different color sub-pixels may be blocked by metal wiring and the light-shielding metal layer may be analyzed. If the degree to which the thin-film transistor T in the first pixel circuit 10A is blocked is greater than the degree to which the thin film transistor T in the second pixel circuit 10B is blocked, then under the same light intensity (for example, the first light intensity or the second light intensity), the amount of light received by the thin-film transistor T in the first pixel circuit 10A may be less than the amount of light received by the thin-film transistor T in the second pixel circuit 10B, and the leakage current generated by the thin-film transistor T in the first pixel circuit 10A may be less than the leakage current generated by the thin-film transistor T in the second pixel circuit 10B, which may cause the gate potential of the driving transistor M3 in the first pixel circuit 10A to rise less than the gate potential of the driving transistor M3 in the second pixel circuit 10B, thereby causing the light-emitting of the first light-emitting element 11A to decrease less than the luminance of the second light-emitting element 11A. The degree of decrease in the luminous brightness of the second light-emitting element 11B may be reduced by setting the capacitance value (for example, the first capacitance value or the second capacitance value) of the first photosensitive capacitor Cst2A in the first pixel circuit 10A to be smaller than the capacitance value (for example, the first capacitance value or the second capacitance value) of the second photosensitive capacitor Cst2B in the second pixel circuit 10B. Accordingly, the ability of the first photosensitive capacitor Cst2A in the first pixel circuit 10A to maintain the gate potential of the driving transistor M3 may be smaller than the ability of the second photosensitive capacitor Cst2B in the second pixel circuit 10B to maintain the gate potential of the driving transistor M3 to reduce the rising degree of the gate potential of the driving transistor M3 in the second pixel circuit 10B to a greater extent, and reduce the degree of decrease in the luminous brightness of the second light-emitting element 11B, thereby reducing the difference in the brightness change of the first frame of the first light-emitting element 11A and the second light-emitting element 11B of different colors under strong light irradiation, and the color cast problem under strong light irradiation may be reduced.

Similarly, if the degree of shielding of the thin-film transistor T in the first pixel circuit 10A is less than the degree of shielding of the thin-film transistor T in the second pixel circuit 10B, then under the same light intensity (for example, the first light intensity or the second light intensity), the amount of light received by the thin-film transistor T in the first pixel circuit 10A may be greater than the amount of light received by the thin-film transistor T in the second pixel circuit 10B. At this time, the capacitance value of the first photosensitive capacitor Cst2A in the first pixel circuit 10A (for example, the first capacitance value or the second capacitance value) may be set to be greater than the capacitance value of the second photosensitive capacitor Cst2B in the second pixel circuit 10B (for example, the first capacitance value or the second capacitance value) to reduce the difference in brightness change of the first frame of the first light-emitting element 11A and the second light-emitting element 11B of different colors under strong light irradiation, and reduce the color cast problem under strong light irradiation, which will not be repeated here.

Further, referring to FIGS. 9-10, in one embodiment, the difference between the second capacitance value and the first capacitance value of the first photosensitive capacitor Cst2A may be a first difference, and the difference between the second capacitance value and the first capacitance value of the second photosensitive capacitor Cst2B may be a second difference. The first difference and the second difference may be different.

The difference between the second capacitance value and the first capacitance value of the first photosensitive capacitor Cst2A (i.e., the first difference) may refer to the change in the capacitance value of the first photosensitive capacitor Cst2A when the light intensity changes from the second light intensity to the first light intensity, and the first difference may reflect the sensitivity of the first photosensitive capacitor Cst2A to the light intensity to a certain extent.

The difference between the second capacitance value and the first capacitance value of the second photosensitive capacitor Cst2B (i.e., the second difference) may refer to the change in the capacitance value of the second photosensitive capacitor Cst2B when the light intensity changes from the second light intensity to the first light intensity, and the second difference may reflect the sensitivity of the second photosensitive capacitor Cst2B to the light intensity to a certain extent.

Furthermore, under the same change in light intensity (for example, the light intensity changes from the second light intensity to the first light intensity), the change in capacitance value of the first photosensitive capacitor Cst2A (for example, the first difference) and the change in capacitance value of the second photosensitive capacitor Cst2B (for example, the second difference) may be set to be different to reduce the difference in brightness change of the first frame of the different color sub-pixels under strong light conditions by adjusting the different sensitivity of the first photosensitive capacitor Cst2A and the second photosensitive capacitor Cst2B in the different color sub-pixels to the light intensity, and to reduce the color cast problem of the display panel under strong light. The greater the change in the amount of light received by the thin-film transistor T in the sub-pixel, the greater the change in the capacitance value of its photosensitive capacitor Cst2, and vice versa.

Exemplarily, if the degree of shielding of the thin-film transistor T in the first pixel circuit 10A is greater than the degree of shielding of the thin-film transistor T in the second pixel circuit 10B, then under the same light intensity change amplitude (for example, the light intensity changes from the second light intensity to the first light intensity), the light intensity change amplitude received by the thin-film transistor T in the first pixel circuit 10A may be smaller than the light intensity change amplitude received by the thin-film transistor T in the second pixel circuit 10B, and the leakage current change amplitude generated by the thin-film transistor T in the first pixel circuit 10A may be smaller than the leakage current change amplitude generated by the thin-film transistor T in the second pixel circuit 10B, which may cause the gate potential rise degree of the driving transistor M3 in the first pixel circuit 10A to be smaller than the gate potential rise degree of the driving transistor M3 in the second pixel circuit 10B, thereby causing the luminance reduction degree of the first light-emitting element 11A to be smaller than the luminance reduction degree of the second light-emitting element 11B. At this time, By setting the capacitance change of the first photosensitive capacitor Cst2A (e.g., the first difference) to be smaller than the capacitance change of the second photosensitive capacitor Cst2B (e.g., the second difference), the first photosensitive capacitor Cst2A in the first pixel circuit 10A may maintain the gate potential of the driving transistor M3 with a smaller change in the gate potential of the second photosensitive capacitor Cst2B in the second pixel circuit 10B. Thus, by adjusting the sensitivity of the first photosensitive capacitor Cst2A to light intensity to be smaller than the sensitivity of the second photosensitive capacitor Cst2B to light intensity, the first photosensitive capacitor Cst2A and the second photosensitive capacitor Cst2B may maintain the gate potential of the driving transistor M3 and match the change in the amount of light received by the thin-film transistor T in the first pixel circuit 10A and the second pixel circuit 10B, thereby reducing the difference in the brightness change of the first frame of the first light-emitting element 11A and the second light-emitting element 11B under different light intensities and improving the color cast problem.

Similarly, if the degree of shielding of the thin-film transistor T in the first pixel circuit 10A is less than the degree of shielding of the thin-film transistor T in the second pixel circuit 10B, then under the same light intensity change amplitude (for example, the light intensity changes from the second light intensity to the first light intensity), the light intensity change amplitude received by the thin-film transistor T in the first pixel circuit 10A may be greater than the light intensity change amplitude received by the thin-film transistor T in the second pixel circuit 10B. At this time, the change in the capacitance value of the first photosensitive capacitor Cst2A (for example, the first difference) may be set to be smaller than the change in the capacitance value of the second photosensitive capacitor Cst2B (for example, the second difference) to reduce the difference in brightness change in the first frame between the first light-emitting element 11A and the second light-emitting element 11B under different light intensities, thereby reducing the color cast problem, which will not be elaborated here.

In one embodiment, the first light intensity and the second light intensity may be both greater than the preset light intensity threshold, the photosensitive capacitor Cst2 may have a constant capacitance value under the third light intensity, the third light intensity may be less than or equal to the preset light intensity threshold, and the constant capacitance value of the first photosensitive capacitor Cst2A may be different from the constant capacitance value of the second photosensitive capacitor Cst2B.

Specifically, the preset light intensity threshold may be used to distinguish between weak light and strong light conditions, then the third light intensity may refer to the light intensity under weak light conditions, and the first light intensity and the second light intensity may refer to the light intensity under strong light conditions.

Under weak light conditions (e.g., the third light intensity), because the degree of shielding of the thin-film transistors T in the first pixel circuit 10A and the second pixel circuit 10B of different color sub-pixels may be different, the amount of light received by the thin-film transistors T in the first pixel circuit 10A and the second pixel circuit 10B may be different, and the leakage current generated by the thin-film transistors T in the first pixel circuit 10A and the second pixel circuit 10B may be different, which may make the first light-emitting element 11A and the second light-emitting element 11B have different brightness changes under weak light conditions, resulting in the problem of color cast of the display panel under weak light conditions.

In this embodiment, the constant capacitance value of the first photosensitive capacitor Cst2A and the constant capacitance value of the second photosensitive capacitor Cst2B under the third light intensity may be set to be different such that the first photosensitive capacitor Cst2A and the second photosensitive capacitor Cst2B located in different color sub-pixels may have different constant capacitance values under weak light conditions to balance the difference in the amount of light received by the thin-film transistor T in the first photosensitive capacitor Cst2A and the second photosensitive capacitor Cst2B under weak light conditions. Under the weak light conditions, the greater the amount of light received by the thin-film transistor T in the sub-pixel, the greater the fixed capacitance value of its photosensitive capacitor Cst2, and vice versa, so as to reduce the difference in brightness change of sub-pixels of different colors under weak light conditions, and reduce the color cast problem of the display panel under weak light irradiation.

In one embodiment, if the degree of shielding of the thin-film transistor T in the first pixel circuit 10A is greater than the degree of shielding of the thin-film transistor T in the second pixel circuit 10B, then under the same light intensity (for example, the third light intensity), the amount of light received by the thin-film transistor T in the first pixel circuit 10A may be less than the amount of light received by the thin-film transistor T in the second pixel circuit 10B, and the leakage current generated by the thin-film transistor T in the first pixel circuit 10A may be less than the leakage current generated by the thin-film transistor T in the second pixel circuit 10B, which may cause the gate potential of the driving transistor M3 in the first pixel circuit 10A to rise less than the gate potential of the driving transistor M3 in the second pixel circuit 10B, thereby causing the luminance of the first light-emitting element 11A to decrease less than the luminance of the second light-emitting element 11B. At this time, by setting the capacitance value (e.g., constant capacitance value) of the first photosensitive capacitor Cst2A in the first pixel circuit 10A to be smaller than the capacitance value (e.g., constant capacitance value) of the second photosensitive capacitor Cst2B in the second pixel circuit 10B, the ability of the first photosensitive capacitor Cst2A in the first pixel circuit 10A to maintain the gate potential of the driving transistor M3 may be smaller than the ability of the second photosensitive capacitor Cst2B in the second pixel circuit 10B to maintain the gate potential of the driving transistor M3 to reduce the rising degree of the gate potential of the driving transistor M3 in the second pixel circuit 10B to a greater extent, and reduce the degree of decrease in the luminance of the second light-emitting element 11B, thereby reducing the brightness change difference between the first light-emitting element 11A and the second light-emitting element 11B of different colors under weak light irradiation, and improving the color cast problem under weak light irradiation.

Similarly, if the degree of shielding of the thin-film transistor T in the first pixel circuit 10A is less than that of the thin-film transistor T in the second pixel circuit 10B, then under the same light intensity (for example, the third light intensity), the amount of light received by the thin-film transistor T in the first pixel circuit 10A may be greater than the amount of light received by the thin-film transistor T in the second pixel circuit 10B. At this time, the capacitance value (for example, a fixed capacitance value) of the first photosensitive capacitor Cst2A in the first pixel circuit 10A may be set to be greater than the capacitance value (for example, a fixed capacitance value) of the second photosensitive capacitor Cst2B in the second pixel circuit 10B to reduce the brightness change difference between the first light-emitting element 11A and the second light-emitting element 11B of different colors under weak light irradiation, and reduce the color cast problem under weak light irradiation, which will not be repeated here.

Figure 11:
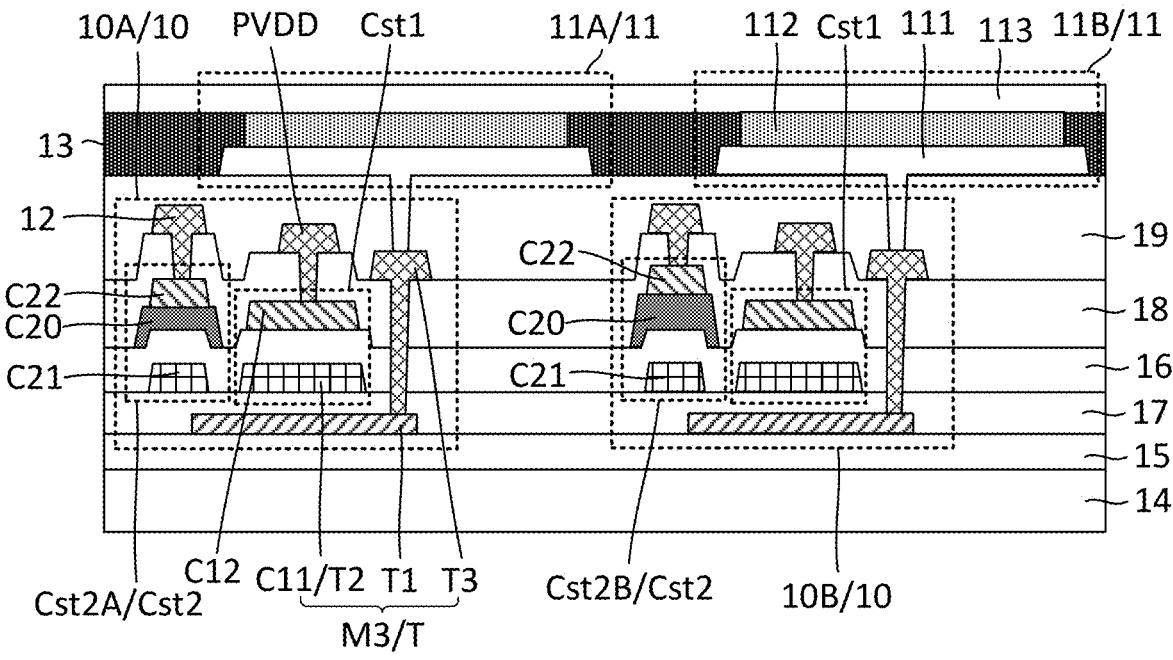
FIG. 11 illustrates a partial cross-sectional view of another exemplary display panel according to various embodiments of the present disclosure.

FIG. 11 is a schematic diagram of a partial cross-sectional structure of another exemplary display panel provided by an embodiment of the present disclosure. As shown in FIG. 11, in one embodiment, the photosensitive capacitor Cst2 may further include a photosensitive dielectric layer C20 located between the first electrode C21 and the second electrode C22, and the first electrode C21, the photosensitive dielectric layer C20 and the second electrode C22 may be stacked and arranged on one side of the substrate 14. Along the thickness direction of the substrate 14, the first electrode C21, the photosensitive dielectric layer C20 and the second electrode C22 may have overlapping areas. The thickness of the photosensitive dielectric layer C20 in the first photosensitive capacitor Cst2A may be different from the thickness of the photosensitive dielectric layer C20 in the second photosensitive capacitor Cst2B.

The specific structure of the photosensitive capacitor Cst2 may refer to the above embodiment, which will not be repeated here.

In one embodiment, by adjusting the thickness of the photosensitive dielectric layer C20 in the first photosensitive capacitor Cst2A and the second photosensitive capacitor Cst2B in different color sub-pixels to be different, the capacitance values of the first photosensitive capacitor Cst2A and the second photosensitive capacitor Cst2B may be different.

The smaller the thickness of the photosensitive dielectric layer C20, the larger the constant capacitance value, the first capacitance value and the second capacitance value of the photosensitive capacitor Cst2; and the larger the thickness of the photosensitive dielectric layer C20, the smaller the constant capacitance value, the first capacitance value and the second capacitance value of the photosensitive capacitor Cst2, but it is not limited to this.

For example, as shown in FIG. 11, the thickness of the photosensitive dielectric layer C20 in the first photosensitive capacitor Cst2A may be less than the thickness of the photosensitive dielectric layer C20 in the second photosensitive capacitor Cst2B, then under the same light intensity, the capacitance value of the first photosensitive capacitor Cst2A may be less than the capacitance value of the second photosensitive capacitor Cst2B, but it is not limited to this.

In other embodiments, the thickness of the photosensitive dielectric layer C20 in the first photosensitive capacitor Cst2A may also be set to be less than the thickness of the photosensitive dielectric layer C20 in the second photosensitive capacitor Cst2B, and the embodiment of the present disclosure does not specifically limit this.

Further, referring to FIG. 11, in one embodiment, the photosensitive capacitor Cst2 may also include a photosensitive dielectric layer C20 located between the first electrode C21 and the second electrode C22, and the first electrode C21, the photosensitive dielectric layer C20 and the second electrode C22 may be stacked on one side of the substrate 14. Along the thickness direction of the substrate 14, there may be an overlapping area between the first electrode C21, the photosensitive dielectric layer C20 and the second electrode C22. In the overlapping area, along the thickness direction of the substrate 14, the spacing between the first electrode C21 and the second electrode C22 in the first photosensitive capacitor Cst2A may be the first spacing, the spacing between the first electrode C21 and the second electrode C22 in the second photosensitive capacitor Cst2B may be the second spacing, and the first spacing and the second spacing may be different.

The specific structure of the photosensitive capacitor Cst2 may refer to the above embodiment, which will not be repeated here.

In one embodiment, the spacing between the first electrode C21 and the second electrode C22 in the first photosensitive capacitor Cst2A and the second photosensitive capacitor Cst2B located in different color sub-pixels may be adjusted to be different to realize different capacitance values of the first photosensitive capacitor Cst2A and the second photosensitive capacitor Cst2B.

The smaller the spacing between the first electrode C21 and the second electrode C22, the larger the constant capacitance value, the first capacitance value and the second capacitance value of the photosensitive capacitor Cst2; and the larger the spacing between the first electrode C21 and the second electrode C22, the smaller the constant capacitance value, the first capacitance value and the second capacitance value of the photosensitive capacitor Cst2, but it is not limited to this.

For example, as shown in FIG. 11, the spacing between the first electrode C21 and the second electrode C22 in the first photosensitive capacitor Cst2A (i.e., the first spacing) may be smaller than the spacing between the first electrode C21 and the second electrode C22 in the second photosensitive capacitor Cst2B (i.e., the second spacing), then under the same light intensity, the capacitance value of the first photosensitive capacitor Cst2A may be greater than the capacitance value of the second photosensitive capacitor Cst2B, but it is not limited to this.

In other embodiments, the spacing between the first electrode C21 and the second electrode C22 in the first photosensitive capacitor Cst2A may be set smaller than the spacing between the first electrode C21 and the second electrode C22 in the second photosensitive capacitor Cst2B, and the embodiment of the present disclosure does not specifically limit this.

Further, as shown in FIG. 11, the spacing between the first electrode C21 and the second electrode C22 may be adjusted by adjusting the thickness of the film layer between the first electrode C21 and the second electrode C22. The greater the thickness of the film layer between the first electrode C21 and the second electrode C22, the greater the spacing between the first electrode C21 and the second electrode C22.

In one embodiment, as shown in FIG. 11, the thickness of the photosensitive dielectric layer C20 in the first photosensitive capacitor Cst2A may be smaller than the thickness of the photosensitive dielectric layer C20 in the second photosensitive capacitor Cst2B to achieve that the spacing between the first electrode C21 and the second electrode C22 in the first photosensitive capacitor Cst2A (i.e., the first spacing) may be smaller than the spacing between the first electrode C21 and the second electrode C22 in the second photosensitive capacitor Cst2B (i.e., the second spacing), but it is not limited thereto.

Figure 12:
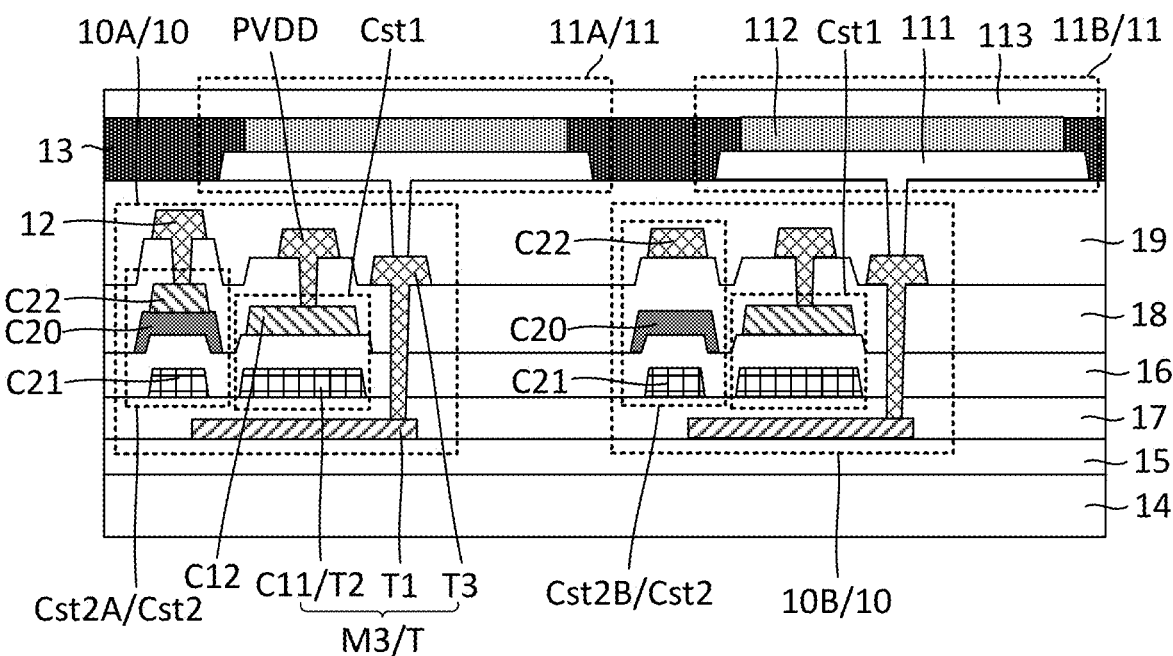
FIG. 12 illustrates a partial cross-sectional view of another exemplary display panel according to various embodiments of the present disclosure.

FIG. 12 is a schematic diagram of a partial cross-sectional structure of another exemplary display panel provided by an embodiment of the present disclosure. As shown in FIG. 12, in one embodiment, along the thickness direction of the substrate 14, the first electrode C21 of the first photosensitive capacitor Cst2A and the first electrode C21 of the second photosensitive capacitor Cst2B may be located in different film layers; and/or, the second electrode C22 of the first photosensitive capacitor Cst2A and the second electrode C22 of the second photosensitive capacitor Cst2B may be located in different film layers.

In one embodiment, the spacing between the first electrode C21 and the second electrode C22 may be adjusted by adjusting the film layer positions of the first electrode C21 and the second electrode C22. The more film layers there are between the first electrode C21 and the second electrode C22, the larger the spacing between the first electrode C21 and the second electrode C22.

In one embodiment, as shown in FIG. 12, the first electrode C21 of the first photosensitive capacitor Cst2A and the first electrode C21 of the second photosensitive capacitor Cst2B may be located in the same film layer, and along the thickness direction of the substrate 14, the second electrode C22 of the first photosensitive capacitor Cst2A may be located on the side of the second electrode C22 of the second photosensitive capacitor Cst2B adjacent to the substrate 14. Accordingly, the number of film layers between the first electrode C21 and the second electrode C22 in the first photosensitive capacitor Cst2A may+be smaller than the number of film layers between the first electrode C21 and the second electrode C22 in the second photosensitive capacitor Cst2B, thereby achieving that the spacing between the first electrode C21 and the second electrode C22 in the first photosensitive capacitor Cst2A (i.e., the first spacing) may be smaller than the spacing between the first electrode C21 and the second electrode C22 in the second photosensitive capacitor Cst2B (i.e., the second spacing), but it is not limited thereto.

Figure 13:
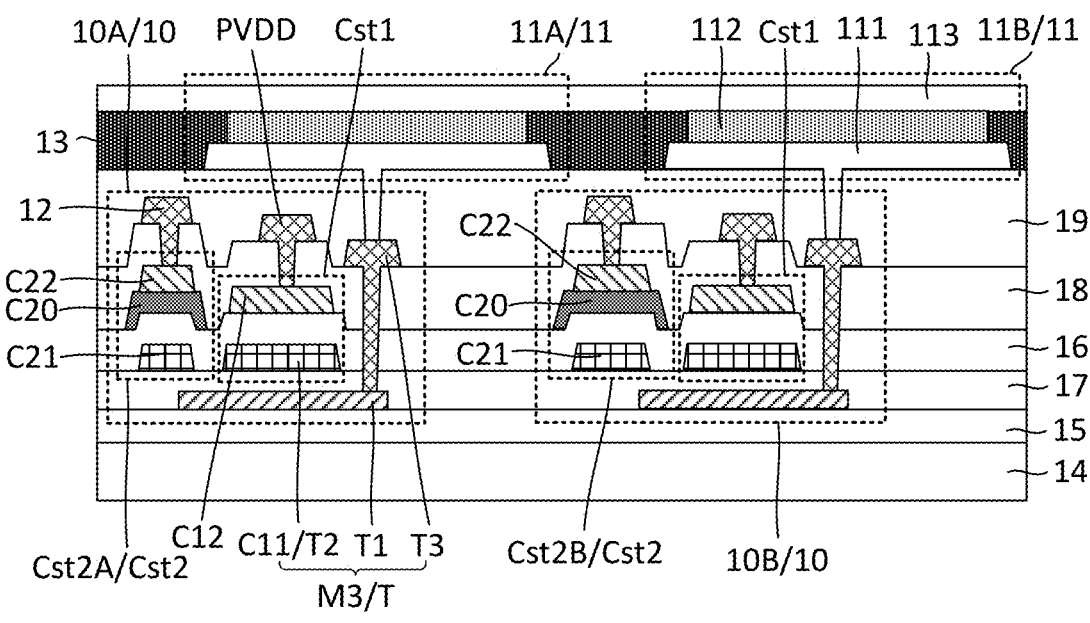
FIG. 13 illustrates a partial cross-sectional view of another exemplary display panel according to various embodiments of the present disclosure.

FIG. 13 is a schematic diagram of a partial cross-sectional structure of another exemplary display panel provided by an embodiment of the present disclosure. As shown in FIG. 13, in one embodiment, the photosensitive capacitor Cst2 may also include a photosensitive dielectric layer C20 located between the first electrode C21 and the second electrode C22, and the first electrode C21, the photosensitive dielectric layer C20 and the second electrode C22 may be stacked on one side of the substrate 14. Along the thickness direction of the substrate 14, the first electrode C21, the photosensitive dielectric layer C20 and the second electrode C22 may have overlapping areas. Along the thickness direction of the substrate 14, the overlapping area between the first electrode C21 and the second electrode C22 in the first photosensitive capacitor Cst2A may be S11, the overlapping area between the first electrode C21 and the second electrode C22 in the second photosensitive capacitor Cst2B may be S12, and S11≠S12.

The specific structure of the photosensitive capacitor Cst2 may refer to the above embodiment, which will not be repeated here.

In this embodiment, by adjusting the overlapping areas between the first electrode C21 and the second electrode C22 in the first photosensitive capacitor Cst2A and the second photosensitive capacitor Cst2B located in different color sub-pixels, the first photosensitive capacitor Cst2A and the second photosensitive capacitor Cst2B may have different capacitance values.

The larger the overlapping area between the first electrode C21 and the second electrode C22, the larger the constant capacitance value, the first capacitance value and the second capacitance value of the photosensitive capacitor Cst2; and the smaller the overlapping area between the first electrode C21 and the second electrode C22, the smaller the constant capacitance value, the first capacitance value and the second capacitance value of the photosensitive capacitor Cst2, but it is not limited thereto.

For example, as shown in FIG. 13, along the thickness direction of the substrate 14, the overlapping area S11 between the first electrode C21 and the second electrode C22 in the first photosensitive capacitor Cst2A may be smaller than the overlapping area S12 between the first electrode C21 and the second electrode C22 in the second photosensitive capacitor Cst2B. Then, under the same light intensity, the capacitance value of the first photosensitive capacitor Cst2A may be smaller than the capacitance value of the second photosensitive capacitor Cst2B, but it is not limited thereto.

In other embodiments, the overlapping area S11 between the first electrode C21 and the second electrode C22 in the first photosensitive capacitor Cst2A may be set to be larger than the overlapping area S12 between the first electrode C21 and the second electrode C22 in the second photosensitive capacitor Cst2B, and the embodiment of the present disclosure does not specifically limit this.

In other embodiments, the materials of the photosensitive dielectric layer C20 in the first photosensitive capacitor Cst2A and the second photosensitive capacitor Cst2B in the sub-pixels of different colors may be adjusted to be different to achieve different capacitance values of the first photosensitive capacitor Cst2A and the second photosensitive capacitor Cst2B, which is not specifically limited in the embodiment of the present disclosure.

It should be noted that the capacitance value (for example, including the constant capacitance value, the first capacitance value, and the second capacitance value) of the photosensitive capacitor Cst2 in the sub-pixels of different colors may be set based on the material of the light-emitting layer in the sub-pixels of different colors, the magnitude of the driving current in the sub-pixels of different colors, and the different degrees of shielding of the thin film transistor T in the sub-pixels of different colors. It is understandable that display panels of different manufacturers or different models may have differences in material selection, driving current design, and metal layer layout, which may lead to different size relationships between the capacitance values of the photosensitive capacitor Cst2 in the sub-pixels of different colors, which is not specifically limited in the embodiment of the present disclosure.

Further, the specific structure of the pixel circuit 10 is not limited to the specific circuit structure provided in the above embodiments, and those skilled in the art may set the specific structure of the pixel circuit 10 according to actual needs.

In one embodiment, as shown in FIG. 3, the pixel circuit 10 may further include a light-emitting reset transistor M7. The gate of the light-emitting reset transistor M7 may be connected to the second scanning signal line S2, the first electrode M71 of the light-emitting reset transistor M7 may be electrically connected to the reference signal line Vref, and the second electrode M72 of the light-emitting reset transistor M7 may be electrically connected to the anode of the light-emitting element 11.

The driving process of the pixel circuit 10 may include that, in the data writing stage, the second scanning signal on the second scanning signal line S2 may turn on the light-emitting reset transistor M7, and the light-emitting reset transistor M7 may write the reference voltage on the reference signal line Vref to the anode of the light-emitting element 11, and may reset the anode potential of the light-emitting element 11, which may reduce the influence of the anode voltage of the light emitting element 11 in the previous frame on the anode voltage of the light emitting element 11 in the next frame, thereby improving display uniformity.

Further, referring to FIG. 3-FIG. 6, in one embodiment, the pixel circuit 10 may also include a first light-emitting control transistor M1 and a second light-emitting control transistor M6. The driving transistor M3, the first light-emitting control transistor M1, the second light-emitting control transistor M6 and the light-emitting element 11 may be connected in series between the first power signal line PVDD and the second power signal line PVEE, and the gate of the first light-emitting control transistor M1 and the gate of the second light-emitting control transistor M6 may both be connected to the light-emitting control signal line EM.

The driving process of the pixel circuit 10 may include that, in the light-emitting stage, the light-emitting control signal on the light-emitting control signal line EM may turn on the first light-emitting control transistor M1 and the second light-emitting control transistor M6, thereby driving the light-emitting element 11 to emit light through the driving transistor M3, thereby realizing the light-emitting and display functions of the display panel.

Further, the film layer structure of the display panel may not be limited to the specific film layer structure provided in the above embodiments, and those skilled in the art can set the film layer structure of the display panel according to actual needs.

For example, as shown in FIG. 2-FIG. 13, in one embodiment, a buffer layer 15 may be provided between the substrate 14 and the active layer T1. The buffer layer 15 may play a role of buffering and isolation.

Further, referring to FIGS. 2-13, in one embodiment, the side of the buffer layer 15 away from the substrate 14 may be sequentially stacked with a gate insulation layer 17, a first interlayer insulation layer 16, a second interlayer insulation layer 18 and a planarization layer 19. Along the thickness direction of the substrate 14, the gate insulation layer 17 may be located between the active layer T1 and the gate T2, the first interlayer insulation layer 16 may be located between the third electrode C11 and the fourth electrode C12, the second interlayer insulation layer 18 may be located between the fourth electrode C12 and the first power signal line PVDD, and the planarization layer 19 may be located between the first power signal line PVDD and the light-emitting element 11.

The gate insulation layer 17, the first interlayer insulation layer 16 and the second interlayer insulation layer 18 may be inorganic film layers. The planarization layer 19 may be an organic film layer.

Figure 14:
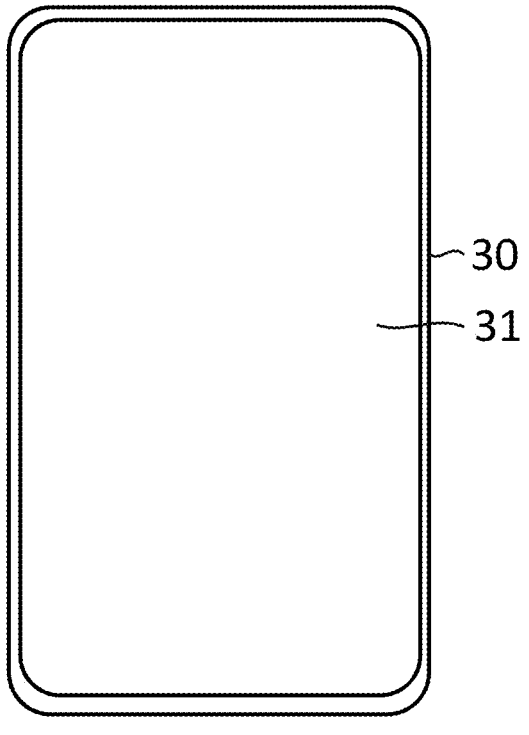
FIG. 14 illustrates an exemplary display device according to various embodiments of the present disclosure.

The present disclosure also provides a display device. FIG. 14 is a schematic diagram of the structure of an exemplary display device according to various embodiments of the present disclosure. As shown in FIG. 14, the display device 30 may include a display panel 31. The display panel 31 may be a display panel described in any embodiment of the present disclosure. Therefore, the display device 30 provided by the embodiment of the present disclosure may have the technical effect of the technical solution in any of the above embodiments. The explanation of the structure and terms that are the same or corresponding to the above embodiments will not be repeated here.

The display device 30 provided by the embodiment of the present disclosure may be a mobile phone as shown in FIG. 14, or any electronic product with a display function, including but not limited to the following categories: television, laptop, desktop display, tablet computer, digital camera, smart bracelet, smart glasses, car display, medical equipment, industrial control equipment, touch interactive terminal, etc., and the embodiment of the present disclosure does not specifically limit this.

The display panel and display device provided by the embodiments of the present disclosure may include a photosensitive capacitor connected in series between the gate of the driving transistor and the first signal line transmitting a constant voltage signal. When the display panel is under a first light intensity with relatively weak light intensity, the photosensitive capacitor may have a smaller first capacitance value. When the display panel is under a second light intensity with relatively strong light intensity, the photosensitive capacitor may have a larger second capacitance value such that the capacitance value of the photosensitive capacitor increases with the increase of the external light intensity. Therefore, when the external light intensity increases, the capacitance value of the photosensitive capacitor may increase, thereby enhancing its ability to maintain the gate potential of the driving transistor, helping to keep the gate potential of the driving transistor unchanged, reducing the degree of decrease in the brightness of the first frame of the display panel when it is exposed to strong light, better maintaining the brightness stability of the display panel, and improving the screen flickering problem. At the same time, it also helps to reduce the difference between the brightness decreases of light-emitting elements of different colors in the first frame after being exposed to strong light, thereby improving the color cast phenomenon.

It should be understood that the various forms of processes shown above can be used to reorder, add or delete steps. For example, the steps recorded in the present invention can be executed in parallel, sequentially, or in different orders. As long as the expected results of the technical solution of the present invention can be achieved, this article does not limit it here.

The above specific implementation does not constitute a limitation on the scope of protection of the present invention. It should be understood by those skilled in the art that various modifications, combinations, sub-combinations and substitutions may be made according to design requirements and other factors. Any modification, equivalent substitution and improvement made within the spirit and principle of the present invention shall be included in the protection scope of the present invention.

What is claimed is:

1. A display panel, comprising:
   a pixel circuit; and
   a light-emitting element electrically connected to the pixel circuit,
   wherein:
   the pixel circuit includes a driving transistor and a photosensitive capacitor;
   the driving transistor is electrically connected to the light-emitting element;
   the photosensitive capacitor includes a first electrode, a second electrode and a photosensitive dielectric layer located between the first electrode and the second electrode;
   the first electrode is electrically connected to a gate of the driving transistor;
   the second electrode is electrically connected to a first signal line;
   the first signal line is configured to transmit a first voltage signal;
   the first voltage signal is a constant voltage signal;
   the photosensitive capacitor has a first capacitance value under a first light intensity and a second capacitance value under a second light intensity;
   the first light intensity is less than the second light intensity; and
   the first capacitance value is less than the second capacitance value.

2. The display panel according to claim 1, further comprising:
   a first power signal line,
   wherein:

the driving transistor is connected in series between the first power signal line and the light-emitting element; and the first signal line and the first power signal line are a same signal line.

3. A display panel, comprising:

a pixel circuit; and a light-emitting element electrically connected to the pixel circuit, wherein:

the pixel circuit includes a driving transistor and a photosensitive capacitor;

the driving transistor is electrically connected to the light-emitting element;

the photosensitive capacitor includes a first electrode and a second electrode;

the first electrode is electrically connected to a gate of the driving transistor;

the second electrode is electrically connected to a first signal line;

the first signal line is configured to transmit a first voltage signal;

the first voltage signal is a constant voltage signal;

the photosensitive capacitor has a first capacitance value under a first light intensity and a second capacitance value under a second light intensity:

the first light intensity is less than the second light intensity;

the first capacitance value is less than the second capacitance value;

the first light intensity and the second light intensity are both greater than a preset light intensity threshold;

the photosensitive capacitor has a constant capacitance value under a third light intensity;

the third light intensity is less than or equal to the preset light intensity threshold; and the constant capacitance value is less than the first capacitance value.

4. The display panel according to claim 3, wherein:

the preset light intensity threshold is A; and $$8000 \text{ lux} \leqslant A \leqslant 12000 \text{ lux}.$$

5. The display panel according to claim 3, further comprising:

a first power signal line, wherein:

the driving transistor is connected in series between the first power signal line and the light-emitting element;

the pixel circuit also includes a storage capacitor;

the storage capacitor includes a third electrode and a fourth electrode;

the third electrode is electrically connected to the gate of the driving transistor;

the fourth electrode is electrically connected to the first power signal line; and the constant capacitance value is less than a capacitance value of the storage capacitor.

6. The display panel according to claim 1, further comprising:

a substrate, wherein:

the photosensitive capacitor is located on one side of the substrate;

the first electrode, the photosensitive dielectric layer and the second electrode are stacked on one side of the substrate; and along a thickness direction of the substrate, the first electrode, the photosensitive dielectric layer and the second electrode have an overlapping area.

7. The display panel according to claim 6, wherein:

along the thickness direction of the substrate, the overlapping area of the first electrode, the photosensitive dielectric layer and the second electrode is equal to an area of the first electrode and/or the second electrode.

8. The display panel according to claim 6, wherein:

the photosensitive dielectric layer has a first dielectric constant under the first light intensity;

the photosensitive dielectric layer has a second dielectric constant under the second light intensity; and the first dielectric constant is smaller than the second dielectric constant.

9. The display panel according to claim 6, wherein:

the driving transistor is connected in series between the first power signal line and the light-emitting element;

the pixel circuit also includes a storage capacitor;

the storage capacitor includes a third electrode and a fourth electrode;

the third electrode is electrically connected to the gate of the driving transistor;

the fourth electrode is electrically connected to the first power signal line;

the third electrode and the fourth electrode are stacked on one side of the substrate;

the fourth electrode is located on a side of the third electrode away from the substrate; and along the thickness direction of the substrate, a distance between the first electrode and the second electrode is greater than a distance between the third electrode and the fourth electrode.

10. The display panel according to claim 6, wherein:

the driving transistor is connected in series between the first power signal line and the light-emitting element;

the pixel circuit also includes a storage capacitor;

the storage capacitor includes a third electrode and a fourth electrode;

the third electrode is electrically connected to the gate of the driving transistor;

the fourth electrode is electrically connected to the first power signal line;

the third electrode and the fourth electrode are stacked on one side of the substrate;

the fourth electrode is located on the side of the third electrode away from the substrate; and along the thickness direction of the substrate, an overlapping area between the first electrode and the second electrode is S1, an overlapping area between the third electrode and the fourth electrode is S2, and S1<S2.

11. The display panel according to claim 6, wherein:

the driving transistor is connected in series between the first power signal line and the light-emitting element;

the pixel circuit also includes a storage capacitor;

the storage capacitor includes a third electrode and a fourth electrode;

the third electrode is electrically connected to the gate of the driving transistor;

the fourth electrode is electrically connected to the first power signal line;

the third electrode and the fourth electrode are stacked on one side of the substrate;

the fourth electrode is located on a side of the third electrode away from the substrate;

the first electrode and the third electrode are located in a same film layer; and/or the second electrode and the fourth electrode are located in a same film layer.

12. The display panel according to claim 6, wherein:

the driving transistor is connected in series between the first power signal line and the light-emitting element;

the pixel circuit also includes a storage capacitor;

the storage capacitor includes a third electrode and a fourth electrode;

the third electrode is electrically connected to the gate of the driving transistor;

the fourth electrode is electrically connected to the first power signal line;

the third electrode and the fourth electrode are stacked on one side of the substrate;

the fourth electrode is located on the side of the third electrode away from the substrate;

the first electrode and the third electrode are a same electrode plate; and the second electrode and the fourth electrode are a same electrode plate.

13. The display panel according to claim 12, wherein:

in a direction perpendicular to the display panel, the photosensitive dielectric layer covers at least a portion of an edge of the fourth electrode.

14. The display panel according to claim 1, wherein the pixel circuit comprises:

a first pixel circuit; and a second pixel circuit, wherein:

the light-emitting element includes a first light-emitting element and a second light-emitting element;

the first pixel circuit is electrically connected to the first light-emitting element;

the second pixel circuit is electrically connected to the second light-emitting element;

the first light-emitting element and the second light-emitting element have different light-emitting colors;

the photosensitive capacitor in the first pixel circuit is a first photosensitive capacitor;

the photosensitive capacitor in the second pixel circuit is a second photosensitive capacitor;

a first capacitance value of the first photosensitive capacitor is different from a first capacitance value of the second photosensitive capacitor; and/or, a second capacitance value of the first photosensitive capacitor is different from a second capacitance value of the second photosensitive capacitor.

15. The display panel according to claim 14, wherein:

a difference between the second capacitance value and the first capacitance value of the first photosensitive capacitor is a first difference;

a difference between the second capacitance value and the first capacitance value of the second photosensitive capacitor is a second difference; and the first difference and the second difference are different.

16. The display panel according to claim 14, wherein:

the first light intensity and the second light intensity are both greater than a preset light intensity threshold;

the photosensitive capacitor has a constant capacitance value under a third light intensity;

the third light intensity is less than or equal to the preset light intensity threshold; and the constant capacitance value of the first photosensitive capacitor is different from the constant capacitance value of the second photosensitive capacitor.

17. The display panel according to claim 14, wherein the photosensitive capacitor also comprises:

a photosensitive dielectric layer located between the first electrode and the second electrode, wherein:

the first electrode, the photosensitive dielectric layer and the second electrode are stacked on one side of the substrate;

along a thickness direction of the substrate, the first electrode, the photosensitive dielectric layer and the second electrode have an overlapping area; and a thickness of the photosensitive dielectric layer in the first photosensitive capacitor is different from a thickness of the photosensitive dielectric layer in the second photosensitive capacitor.

18. The display panel according to claim 14, wherein the photosensitive capacitor further comprises:

a photosensitive dielectric layer located between the first electrode and the second electrode, wherein:

the first electrode, the photosensitive dielectric layer and the second electrode are stacked on one side of the substrate;

along the thickness direction of the substrate, there is an overlapping area between the first electrode, the photosensitive dielectric layer and the second electrode;

in the overlapping area, along the thickness direction of the substrate, a spacing between the first electrode and the second electrode in the first photosensitive capacitor is a first spacing, and a spacing between the first electrode and the second electrode in the second photosensitive capacitor is a second spacing; and the first spacing and the second spacing are different.

19. The display panel according to claim 14, wherein the photosensitive capacitor further comprises:

a photosensitive dielectric layer located between the first electrode and the second electrode, wherein:

the first electrode, the photosensitive dielectric layer and the second electrode are stacked on one side of the substrate;

along the thickness direction of the substrate, the first electrode, the photosensitive dielectric layer and the second electrode have an overlapping area; and along the thickness direction of the substrate, the overlapping area between the first electrode and the second electrode in the first photosensitive capacitor is S11, the overlapping area between the first electrode and the second electrode in the second photosensitive capacitor is S12, and S11≠S12.

20. A display device, comprising:

a display panel, including:

a pixel circuit; and a light-emitting element electrically connected to the pixel circuit, wherein:

the pixel circuit includes a driving transistor and a photosensitive capacitor;

the driving transistor is electrically connected to the light-emitting element;

the photosensitive capacitor includes a first electrode, a second electrode and a photosensitive dielectric layer located between the first electrode and the second electrode;

the first electrode is electrically connected to a gate of the driving transistor;

the second electrode is electrically connected to a first signal line;

the first signal line is configured to transmit a first voltage signal;

the first voltage signal is a constant voltage signal;

the photosensitive capacitor has a first capacitance value under a first light intensity and a second capacitance value under a second light intensity;

the first light intensity is less than the second light intensity; and the first capacitance value is less than the second capacitance value.

* * * * *